(12) United States Patent
Binder et al.

(10) Patent No.: US 12,237,730 B2
(45) Date of Patent: Feb. 25, 2025

(54) MAGNETIC ANGLE SENSOR SYSTEM WITH STRAY FIELD COMPENSATION

(71) Applicant: Infineon Technologies AG, Neubiberg (DE)

(72) Inventors: Gernot Binder, Klagenfurt (AT); Joao Cunha, Munich (DE); Helmut Koeck, Villach (AT); Markus Lehner, Munich (DE)

(73) Assignee: Infineon Technologies AG, Neubiberg (DE)

( * ) Notice: Subject to any disclaimer, the term of this patent is extended or adjusted under 35 U.S.C. 154(b) by 310 days.

(21) Appl. No.: 17/805,378

(22) Filed: Jun. 3, 2022

(65) Prior Publication Data
US 2022/0393554 A1    Dec. 8, 2022

(30) Foreign Application Priority Data

Jun. 7, 2021 (DE) .......................... 102021205720.9

(51) Int. Cl.
*H02K 11/215* (2016.01)
*G01R 33/07* (2006.01)
*H02K 7/00* (2006.01)

(52) U.S. Cl.
CPC ......... *H02K 11/215* (2016.01); *G01R 33/075* (2013.01); *H02K 7/003* (2013.01)

(58) Field of Classification Search
CPC ....... H02K 23/66; H02K 7/003; G01R 33/075
USPC .......................................................... 310/68 B
See application file for complete search history.

(56) References Cited

U.S. PATENT DOCUMENTS

| | | | |
|---|---|---|---|
| 2017/0052038 A1* | 2/2017 | Aichriedler | G01D 5/145 |
| 2019/0372434 A1 | 12/2019 | Heo | |
| 2020/0153314 A1* | 5/2020 | Iwasaki | H02K 7/003 |

FOREIGN PATENT DOCUMENTS

| | | | | |
|---|---|---|---|---|
| CN | 207717028 U | * | 8/2018 | |
| DE | 10250319 A1 | * | 10/2003 | ............. G01D 5/145 |
| DE | 102004020734 A1 | * | 11/2005 | ............. G01D 5/145 |
| DE | 102013103445 A1 | | 10/2014 | |
| DE | 102013217428 A1 | | 11/2014 | |
| DE | 102015101246 A1 | | 7/2016 | |
| DE | 102017104206 A1 | | 9/2017 | |
| DE | 102019216839 A1 | | 5/2021 | |
| JP | 2005-168249 A | | 6/2005 | |
| JP | 2019158411 A | * | 9/2019 | |
| WO | WO-2017135440 A1 | * | 8/2017 | ............... G01B 7/30 |

* cited by examiner

*Primary Examiner* — Jose A Gonzalez Quinones
(74) *Attorney, Agent, or Firm* — Harrity & Harrity, LLP

(57) ABSTRACT

The innovative concept described herein relates to a magnetic angle sensor system having a rotatable shaft, a permanent magnet coupled to the rotatable shaft, and a magnetic field sensor arranged opposite the permanent magnet, wherein the magnetic field sensor is configured to detect a magnetic field prevailing in its detection region. The magnetic angle sensor system comprises means for reducing and/or compensating for an inhomogeneous stray field component of a per se homogeneous external magnetic stray field.

15 Claims, 20 Drawing Sheets

MAGNETIC ANGLE SENSOR SYSTEM WITH STRAY FIELD COMPENSATION

CROSS REFERENCE TO RELATED APPLICATION

This application claims priority to German Patent Application No. 102021205720.9 filed on Jun. 7, 2021, the content of which is incorporated by reference herein in its entirety.

TECHNICAL FIELD

The innovative concept described herein relates to a magnetic angle sensor system having means for compensating for or reducing inhomogeneous stray field components of an external homogeneous magnetic stray field.

BACKGROUND

Angle sensors, or angle sensor systems, are used to determine the current or absolute rotation angle of rotating parts. These are often rotatable shafts, the absolute rotation angle of which can be determined over a full 360° revolution.

For such a rotation angle measurement, two different measurement principles are used in particular. On the one hand, there are so-called inductive angle sensors. These are based on the electrical induction principle, coils (so-called transmit coils, inductive targets and receive coils) being used to measure induction currents. The induction currents are in this case representative of the rotation angle. These inductive angle sensors have the advantage that they are relatively insensitive to magnetic stray fields. They are, however, sometimes complex and therefore expensive to produce.

On the other hand, there are magnetic angle sensors. These measure the rotation angle of the rotating object based on magnetic field changes of a permanent magnet. Magnetic angle sensors, in comparison with the aforementioned inductive angle sensors, are much simpler and therefore more economical to produce. They are therefore used in many mass-producible parts. Owing to their measurement principle, however, they are also susceptible to external magnetic stray fields.

SUMMARY

The innovative concept described herein relates to magnetic angle sensors. In this case, however, external magnetic stray fields lead to measurement errors in the determination of the rotation angle. If the external magnetic stray fields are homogeneous stray fields, they may for example be substantially compensated for using differentially measuring sensor technology. For example, lateral Hall plate pairs are used, the two Hall plates of a pair being rotated through 180° relative to one another. They respectively measure the homogeneous stray field components in the positive and negative directions, so that the respective components cancel one another out.

Depending on the selected material of the rotatable shaft, however, spatial distortions of the per se homogeneous external magnetic field occur. This is to be observed in particular when the shaft consists of soft magnetic or ferromagnetic material. It leads to the magnetic field lines of the external stray field being deflected in their direction both when entering the ferromagnetic shaft and when emerging from the ferromagnetic shaft. This gives rise to inhomogeneous stray field components of the per se homogeneous stray field. These inhomogeneous stray field components, however, can no longer be compensated for using the differential sensor technology and therefore in turn lead to measurement errors in the determination of the rotation angle.

In summary, it may thus be stated that an external stray field which is homogeneous per se may comprise both homogeneous stray field components and inhomogeneous stray field components. The inhomogeneous stray field components in this case occur particularly when the rotating object comprises a soft magnetic or ferromagnetic material. It has been found that these inhomogeneous stray field components (of the per se homogeneous stray field) can lead to measurement errors in the angle measurement.

The present innovative concept provides a solution approach for compensating for or reducing these inhomogeneous stray field components and therefore obtaining more accurate measurement results in the determination of the rotation angle.

This is achieved by a magnetic angle sensor as claimed in claim 1.

The magnetic angle system comprises, inter alia a rotatable shaft and a permanent magnet coupled to the rotatable shaft. The magnetic angle sensor system furthermore comprises a magnetic field sensor, which is arranged opposite the permanent magnet and is configured to detect a magnetic field prevailing in its detection region. The magnetic field sensor is furthermore configured to generate, in response to the detected magnetic field, at least two differential sensor signals with which homogeneous stray field components can be compensated for, and to determine a rotation angle of the shaft based on the at least two differential sensor signals. The rotatable shaft may comprise a soft magnetic or ferromagnetic material. The ferromagnetic material has the effect that an existing external homogeneous magnetic stray field is spatially distorted so that the magnetic field in the detection region of the magnetic field sensor changes in comparison with a situation in which this stray field is not present. The spatial distortion due to the ferromagnetic material causes an inhomogeneous stray field component of the per se homogeneous stray field. This inhomogeneous stray field component leads to measurement errors in the determination of the rotation angle of the shaft. According to the innovative concept described herein, the magnetic angle sensor system comprises means for reducing and/or compensating for the inhomogeneous stray field component.

Further implementations and advantageous aspects of this magnetic angle sensor system are mentioned in the respectively dependent patent claims.

BRIEF DESCRIPTION OF THE DRAWINGS

Some example implementations are represented by way of example in the drawing and will be explained below.

DETAILED DESCRIPTION

Example implementations will be described in more detail below with reference to the figures, elements with the same or a similar function being provided with the same references.

When compensation, in particular stray field compensation, is mentioned in this disclosure, this is intended to mean attenuation or reduction. A stray field compensation is therefore an attenuation or reduction of a measurement deviation due to the stray field. The term compensation may, however, also be understood herein as complete reduction or elimination of a measurement deviation.

Figure 1B:
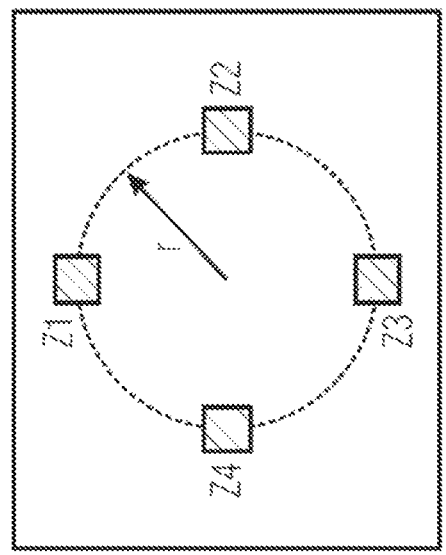
FIG. 1B shows a schematic plan view of a layout of a differentially measuring sensor technology for use in a magnetic angle sensor system according to one example implementation.
Figure 1A:
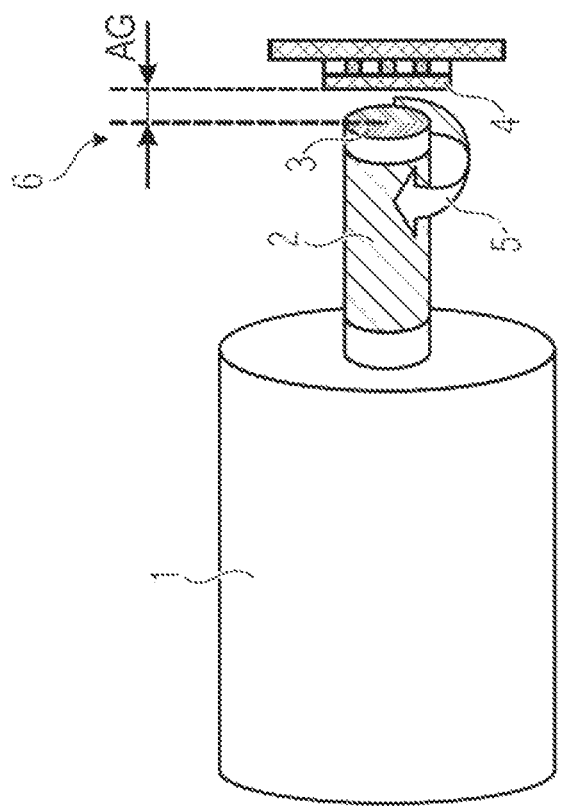
FIG. 1A shows a schematic perspective view of an angle sensor system in a so-called end-of-shaft (EoS) design according to one example implementation.

As an introduction to the present subject matter, FIG. 1A shows by way of example an electric motor 1 having a rotating shaft 2, on which transmission gearing may for example be arranged. The shaft 2 may have a rotation direction 5. A magnetic angle sensor system is furthermore shown. The magnetic angle sensor system comprises a permanent magnet 3 arranged on the shaft 2 as well as a magnetic field sensor 4 arranged opposite the permanent magnet 3.

The permanent magnet 3 is in this case arranged at the end of the shaft 2. Such an arrangement is also referred to as an end-of-shaft (EOS) system.

The permanent magnet 3 is rotatable relative to the magnetic field sensor 4. So that damage does not occur in this case, the permanent magnet 3 and the magnetic field sensor 4 are arranged at a distance from one another. There is thus a space between the magnetic field sensor 4 and the permanent magnet 3, which is also referred to as an air gap. This air gap 6 is also referred to herein by the abbreviation AG.

The magnetic field sensor 4 may comprise a differentially measuring sensor technology. One example of this is shown in FIG. 1B. FIG. 1B shows a plan view of a layout of a differentially measuring sensor technology with four lateral Hall plates Z1, ..., Z4. This layout may be used for a magnetic angle sensor system 100 according to the innovative concept described herein. Instead of the Hall plates Z1, ..., Z4 mentioned here purely by way of example, other sensor elements may however also be used for the purpose of a differentially measuring sensor technology for the magnetic angle sensor system 100. In principle, for example, xMR sensor elements, for example AMR, GMR, TMR, may also be used in order to implement such a differential sensor principle. For example, instead of the Hall plates Z1, ..., Z4 described here purely by way of example, laterally offset xMR elements may also be used.

In the example discussed here and shown in FIG. 1B, the Hall plates Z1, ..., Z4 may be arranged concentrically, and therefore with an equal distance from one another. The Hall plates Z1, ..., Z4 are respectively arranged at a 90° angle to one another. Two opposite Hall plates respectively form a Hall plate pair, which respectively generates a differential signal.

The Hall plates Z1, ..., Z4 are sensitive to a Bz component of the magnetic field of the permanent magnet 3. The signal of the Hall plate Z1 may thus be referred to as Bztop and the signal of the opposite Hall plate Z3 may be referred to as Bzbottom. In a similar way to this, the signal of the Hall plate Z4 may be referred to as Bzleft and the signal of the opposite Hall plate Z2 may be referred to as Bzright. The two opposite Hall plates Z1 and Z3 form a Hall plate pair which generates the differential sensor signal Bztop−Bzbottom. The Hall plates Z1 and Z3 form a first Hall plate pair which generates the differential sensor signal Bztop−Bzbottom. The opposite Hall plates Z2 and Z4 form a second Hall plate pair which generates the differential sensor signal Bzleft−Bzright.

The rotation angle of the shaft 2 is calculated from these two differential sensor signals that are generated by the Hall plate pairs (Bztop−Bzbottom) and (Bzleft−Bzright). Because of the differential signal path, homogeneous external magnetic fields are in this case substantially suppressed.

As already mentioned in the introduction, there is an air gap AG between the permanent magnet 3 and the magnetic field sensor 4. With an increasing air gap AG, the signal amplitude of the differential sensor signals also becomes smaller. In order to obtain a sufficiently large signal amplitude, and therefore to produce a signal-to-noise ratio (SNR) which is as large as possible, the signal amplitude should naturally be as large as possible.

Figure 2A:
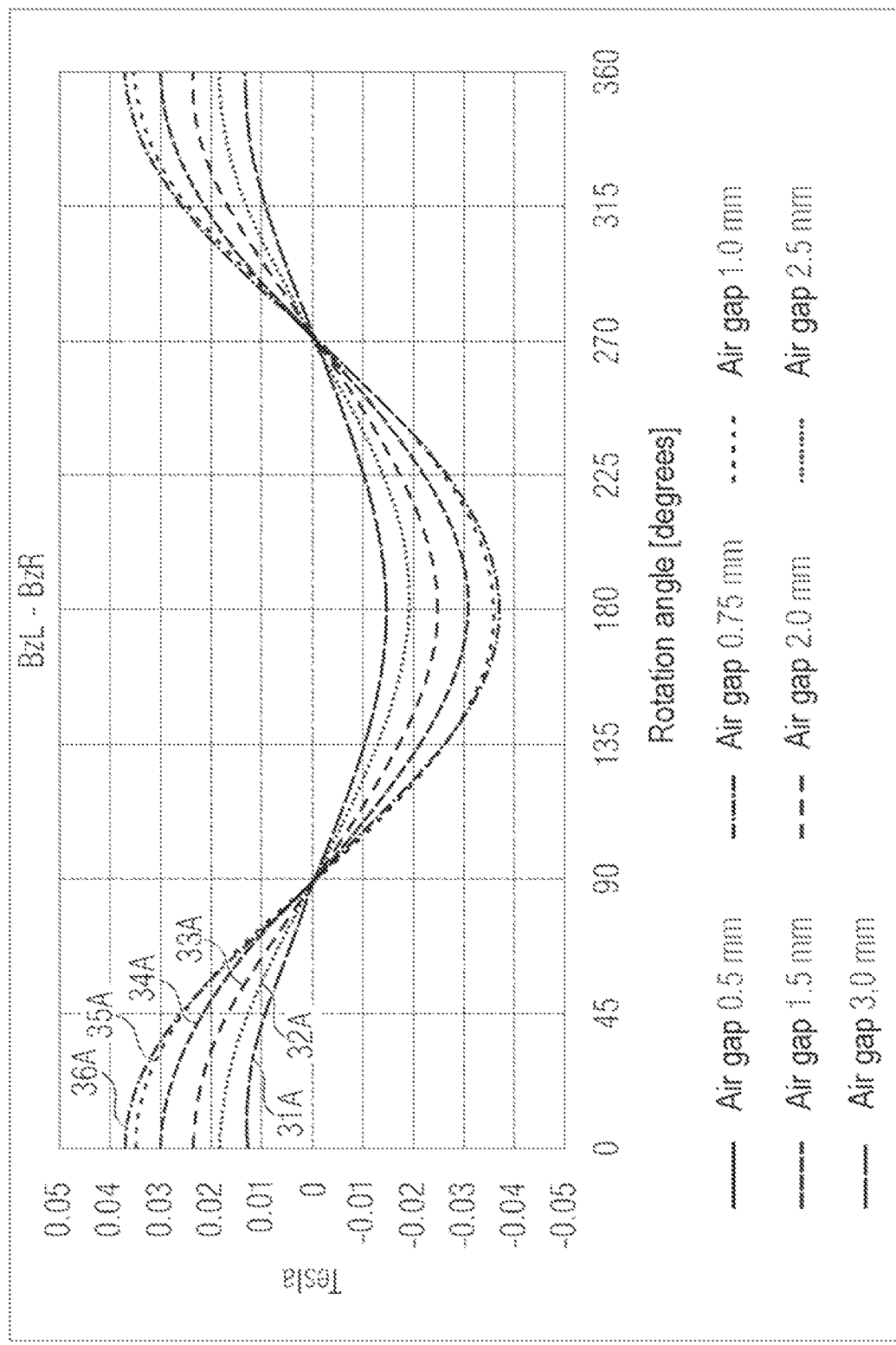
FIGS. 2A, 2B show graphs to illustrate differential signals of a differentially measuring sensor technology with air gaps of different sizes without the presence of an external homogeneous magnetic stray field.
Figure 2B:
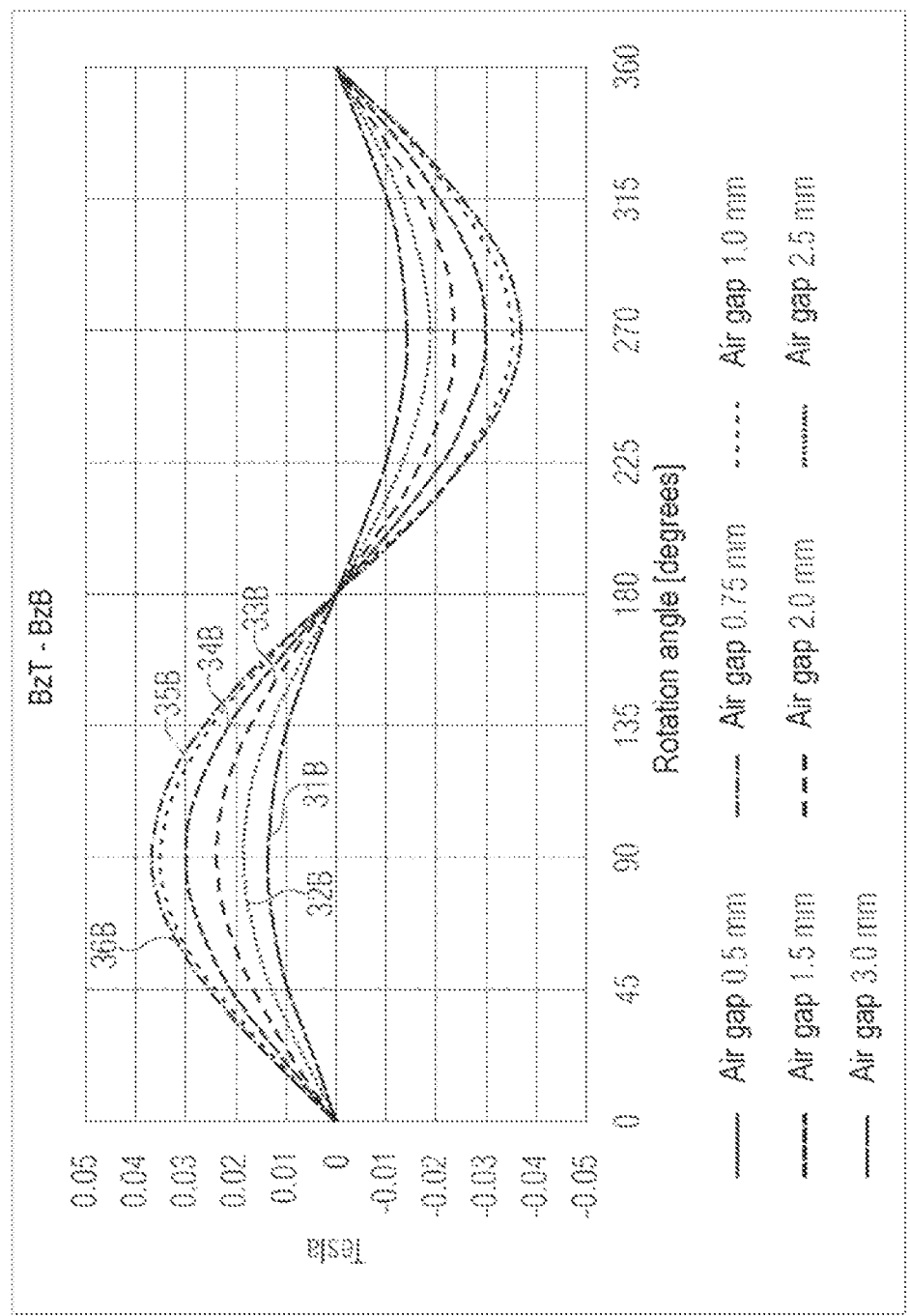

FIGS. 2A and 2B show the effect of the air gap AG on the signal amplitudes of the differential sensor signals without the presence of an external homogeneous magnetic stray field. FIG. 2A shows the differential sensor signal BzL−BzR of the two Hall plates Z4 and Z2. FIG. 2B shows the differential sensor signal BzT−BzB of the two Hall plates Z1 and Z3.

The curve 31A depicted in FIG. 2A shows the signal amplitude with an air gap of 3.0 mm. The curve 32A shows the signal amplitude with an air gap of 2.5 mm. The curve 33A shows the signal amplitude with an air gap of 2.0 mm. The curve 34A shows the signal amplitude with an air gap of 1.5 mm. The curve 35A shows the signal amplitude with an air gap of 1.0 mm. The curve 36A shows the signal amplitude with an air gap of 0.75 mm.

The curve 31B depicted in FIG. 2B shows the signal amplitude with an air gap of 3.0 mm. The curve 32B shows the signal amplitude with an air gap of 2.5 mm. The curve 33B shows the signal amplitude with an air gap of 2.0 mm. The curve 34B shows the signal amplitude with an air gap of 1.5 mm. The curve 35B shows the signal amplitude with an air gap of 1.0 mm. The curve 36B shows the signal amplitude with an air gap of 0.75 mm.

Figure 2C:
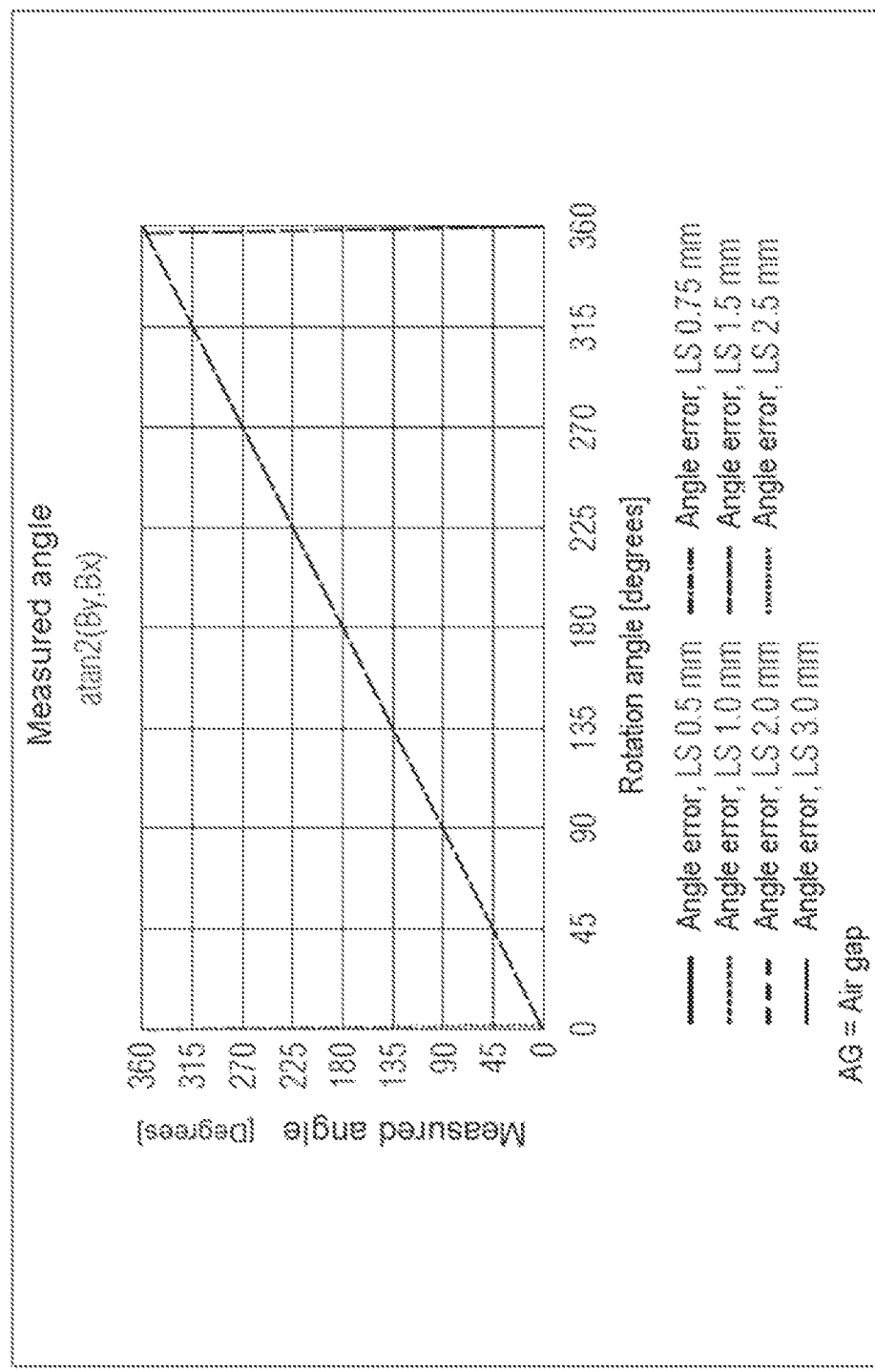
FIG. 2C shows a graph to illustrate the rotation angle which can be calculated from the differential signals of the differentially measuring sensor technology, likewise with air gaps of different sizes and without the presence of an external homogeneous magnetic stray field.

FIG. 2C shows the rotation angle of the shaft, which can be calculated from the two differential sensor signals (FIGS. 2A, 2B), for example using the arctan function. Here again, angle errors occur as a function of the air gap. The angle error indicates the deviation of the calculated rotation angle in relation to the actual (mechanical) rotation angle or reference angle of the shaft 2. With an ideal arrangement of the permanent magnet 3 (arranged on the shaft 2) relative to the magnetic field sensor 4, however, this angle error becomes very small.

Figure 2D:
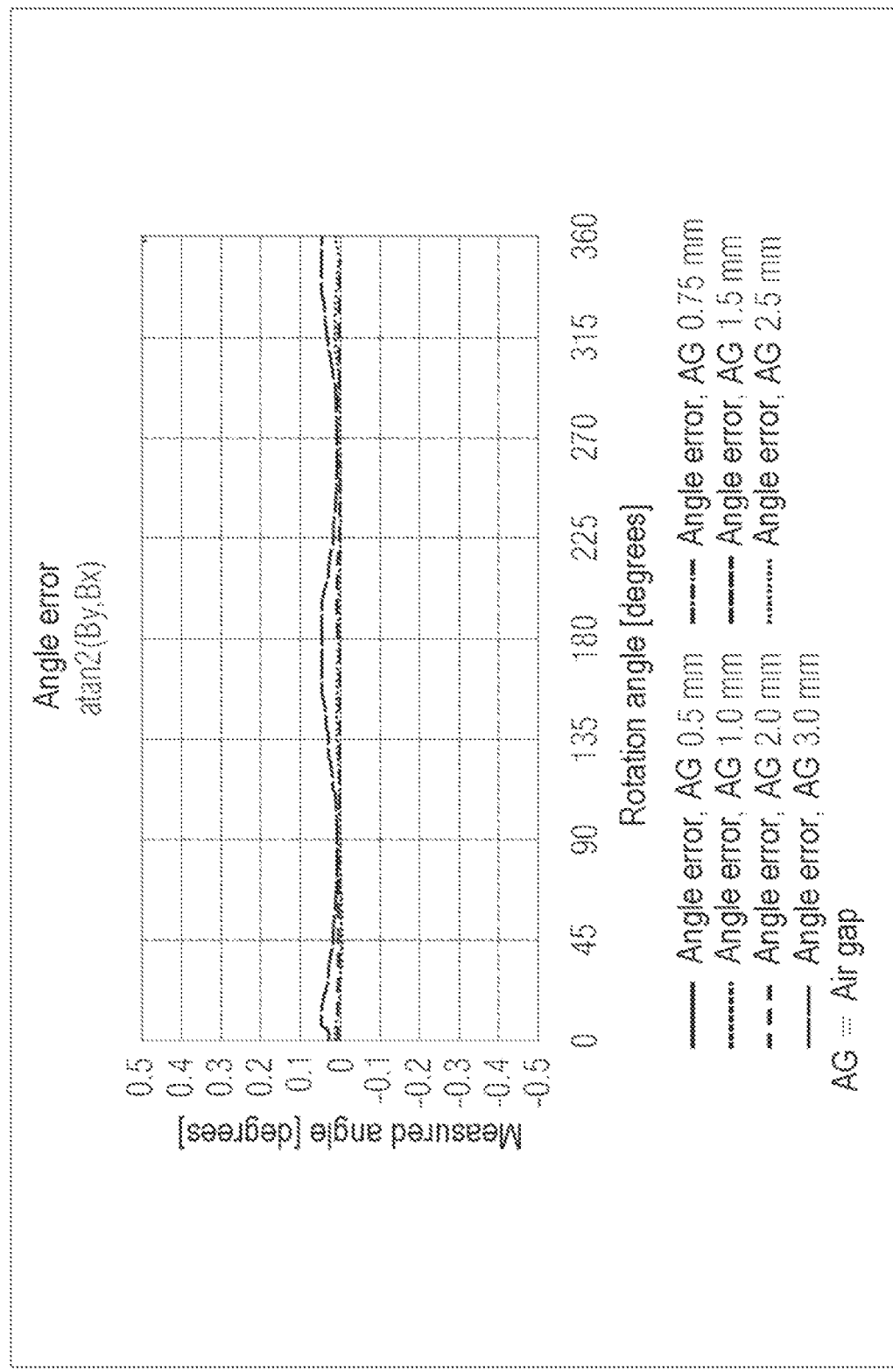
FIG. 2D shows a graph to illustrate the angle error with air gaps of different sizes and without the presence of an external homogeneous magnetic stray field.

As may be seen in FIG. 2D, the angle errors can be deviations of less than 0.1 degree. Accordingly, although a larger air gap leads to smaller signal amplitudes, the angle error due to the air gap is nevertheless negligibly small with an otherwise ideal arrangement of the permanent magnet 3 relative to the magnetic field sensor 4. This applies to the consideration given above without the presence of an external homogeneous magnetic stray field.

Figure 3:
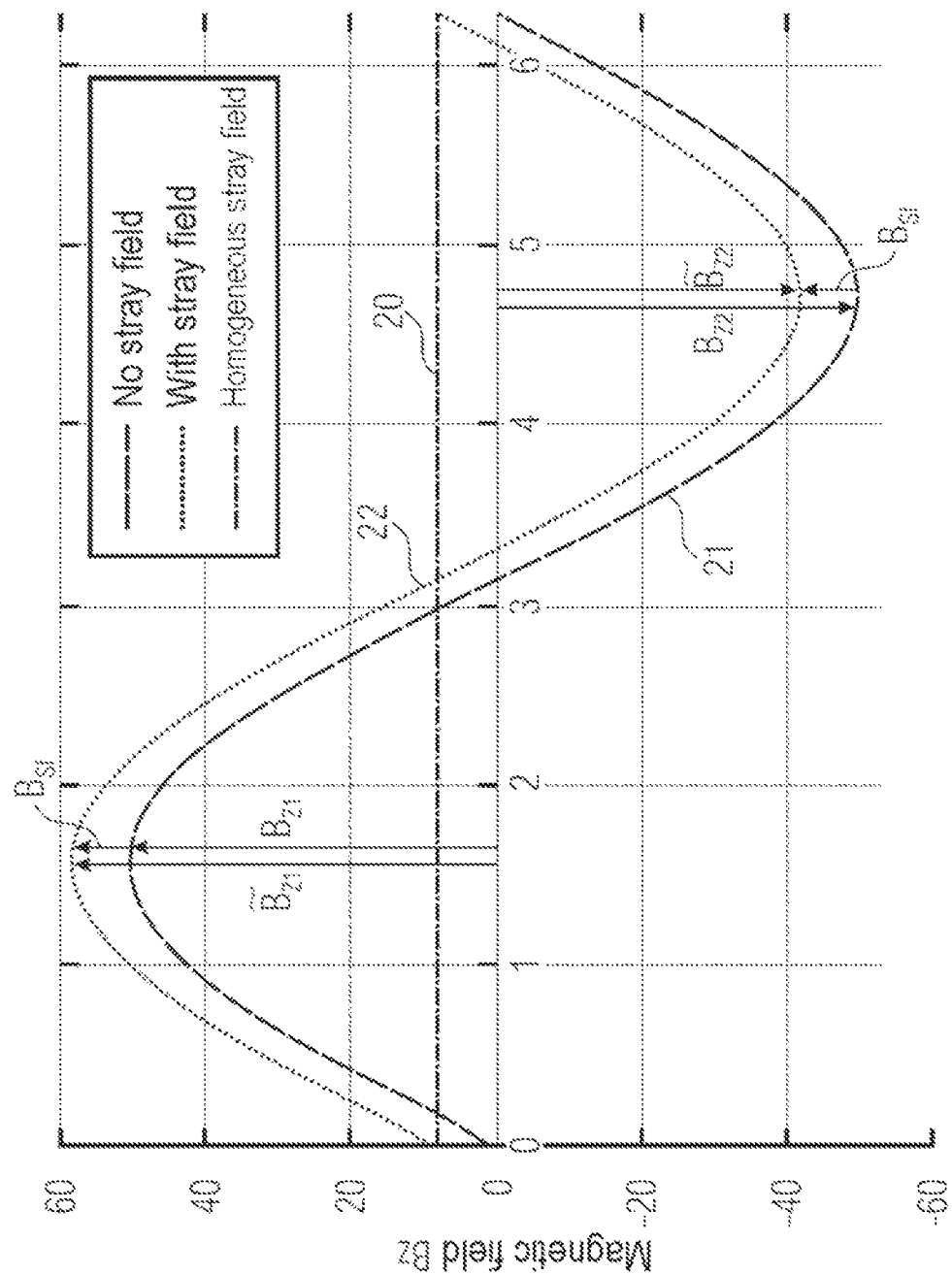
FIG. 3 shows a graph to illustrate the offset due to an external homogeneous magnetic stray field.

FIG. 3, however, shows the effects of an external homogeneous magnetic stray field on the differential sensor signals. The graph depicted illustrates the effect of an external homogeneous magnetic stray field on the measurement of the useful magnetic field of the permanent magnet. The curve 21 shows the sinusoidal profile of the measured useful magnetic field in the Bz direction without the presence of an external homogeneous stray field. A maximum is denoted here by $B_{Z1}$ and a minimum is denoted by $B_{Z2}$.

The curve 22, on the other hand, shows the sinusoidal profile of the measured useful magnetic field in the Bz direction in the presence of an external homogeneous stray field. A maximum is denoted here by $\widetilde{B_{Z1}}$ and a minimum is denoted by $\widetilde{B_{Z2}}$.

The straight line 20 indicates the amplitude of the homogeneous stray field. As may be seen, the homogeneous stray field leads to a displacement or an offset of the sensor signal. This offset is denoted here by $B_{Sf}$. The useful magnetic field may be calculated as follows with the differential sensor signals (BzT−BzB & BzL−BzR) while compensating for the homogeneous stray field (offset compensation):

$$B_{sens} = \widetilde{B_{Z1}} - \widetilde{B_{Z2}} = (B_{z1}+B_{sf})-(B_{z2}+B_{sf}) = B_{z1}+B_{sf}-B_{z2}-B_{sf} = B_{z1}-B_{z2} = 2 \cdot B_{z1}$$

Such homogeneous stray fields may thus be reduced relatively well or entirely compensated for using the method described above with the use of differential sensor signals.

It has now been found, however, that the material of the shaft 2 may likewise be a cause of angle errors. This has been observed particularly when the shaft 2 comprises a ferromagnetic material. The ferromagnetic material can lead to spatial distortions of the magnetic field lines of the per se homogeneous stray field. These spatial distortions lead to the per se homogeneous stray field having an inhomogeneous stray field component, which in turn leads to angle errors. Yet since these stray field components are inhomogeneous, as mentioned, these inhomogeneous stray field components cannot be compensated for by the method described above with the use of differential sensor signals.

Unfortunately, ferromagnetic shafts are widely used in such rotation angle determinations. The ferromagnetic shaft has a high magnetic permeability $\mu_{mag}$. The magnetic permeability describes a resistance of a material to a magnetic field. In other words: it is a measure of the degree to which a magnetic field can permeate through a material.

Because of its low magnetic reluctance (e.g., high permeability), the ferromagnetic shaft acts as a flux concentrator for the magnetic field. Homogeneous magnetic (stray) fields in the environment of the sensor system are deflected and distorted by the shaft. The magnetic stray field is coupled into the signal path of the sensor. Since the stray field has a different size and direction at the individual Hall plates, it is no longer suppressed by the differential signal path and leads to an increased angle error.

The present innovative concept, however, provides means for compensating for these inhomogeneous stray field components and therefore ensuring a more accurate measurement result in the determination of the rotation angle of the shaft 2.

Figure 4:
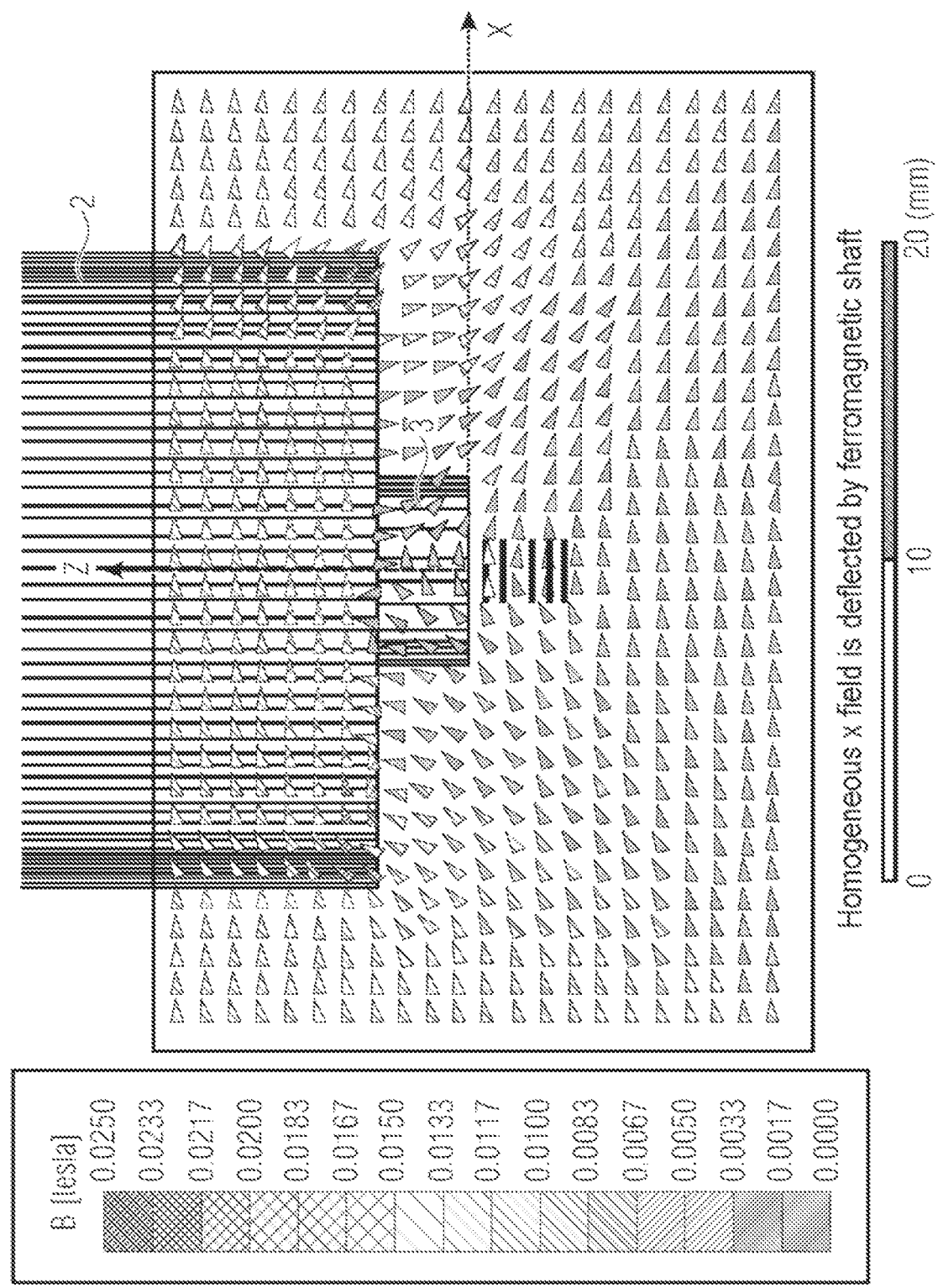
FIG. 4 shows a schematic side view of a ferromagnetic shaft to illustrate the way in which the ferromagnetic material of the shaft spatially distorts the magnetic field lines of the per se homogeneous stray field and therefore leads to inhomogeneous stray field components.

FIG. 4 shows a simulation to illustrate the above-described spatial distortion of the per se homogeneous stray field. FIG. 4 shows a cross section (X-Z plane) of a ferromagnetic shaft 2. The rotation axis of the shaft 2 is arranged in the Z direction. The X axis extends from left to right in the image. The Y axis extends into the image plane. The shaft 2 depicted here has, for example, a permeability of $\mu_{mag}$=4000 and a diameter of 20 mm, a homogeneous 5 mT stray field having been applied in the X direction.

The shaft 2 depicted comprises a ferromagnetic material. A permanent magnet 3 is arranged at the axial shaft end. FIG. 4 shows only the external homogeneous magnetic stray field. Magnetic field lines of the permanent magnet 3 are not represented. That is to say, in this plot the permanent magnet 3 has been placed in a vacuum (μr=1). The permanent magnet 3 therefore does not influence the field distribution of the homogeneous stray field. The plot merely shows the magnetic stray field vectors but not the vectors of the magnetic field of the permanent magnet 3. The influence of the ferromagnetic shaft 2 on the stray field may be seen clearly from this representation.

The homogeneous stray field shown here by way of example in this case extends in the positive X direction, e.g., from left to right in the image. The arrows depicted indicate the direction of the magnetic field lines at the respective locations. The color scale or grayscale depicted to the left in FIG. 4 indicates the magnitude of the magnetic field lines at the corresponding locations.

As may be seen from FIG. 4, at a sufficient distance from the shaft 2 the homogeneous stray field still has a homogeneous profile in the positive X direction (here: from left to right). The homogeneous stray field thus has a homogeneous stray field component in these regions. The homogeneous stray field is distinguished inter alia in that its magnetic field vectors substantially all extend in the same direction, e.g., in a main propagation direction (for example X direction).

The closer the stray field comes in the direction of the shaft 2, however, the more significantly both the magnitude and the direction of the magnetic field lines of the homogeneous stray field vary. This means that the per se homogeneous stray field experiences a spatial distortion here, which causes an inhomogeneous stray field component. The inhomogeneous stray field component is distinguished inter alia in that the direction of the magnetic field vectors deviates from the main propagation direction (for example with components in the X and Y directions).

In the left-hand part of the ferromagnetic shaft 2, the magnetic field lines enter the shaft 2 and are so to speak attracted by the ferromagnetic shaft 2. The direction of the magnetic field lines or magnetic field vectors changes from the pure X direction (left to right) into a direction toward the ferromagnetic shaft 2. This means that the direction of the magnetic field lines acquires a positive component in the Z direction (upward) in addition to the X direction.

In the right-hand part of the ferromagnetic shaft 2, conversely, the magnetic field lines emerge from the shaft 2 and are so to speak repelled by the ferromagnetic shaft 2. The direction of the magnetic field lines changes from the pure X direction (left to right) into a direction away from the ferromagnetic shaft 2. This means that the direction of the magnetic field lines acquires a negative component in the Z direction (downward) in addition to the X direction.

This now leads in total to stray field values with opposite signs at the Hall plate pairs Z1, . . . , Z4 described above, and to corresponding measurement errors in the differential sensor signals (Bzleft and Bzright or Bztop and Bzbottom). These stray field values can therefore no longer be suppressed by the differential sensor principle.

The homogeneous magnetic stray field thus experiences a spatial distortion because of the ferromagnetic material of the shaft 2, which is reflected in a deflection of the magnetic field lines. This spatial distortion now leads to the per se homogeneous stray field having an inhomogeneous stray field component in the vicinity of the ferromagnetic shaft 2.

As already mentioned in the introduction, this inhomogeneous stray field component cannot be compensated for using a differentially measuring sensor technology. This inhomogeneous stray field component leads to the magnetic field varying in the detection region of the magnetic field sensor (in comparison with a situation in which there is no stray field). This in turn leads to measurement errors in the determination of the rotation angle of the shaft 2.

The innovative concept described herein therefore proposes magnetic circuit concepts in order to reduce the influence of ferromagnetic shafts, which leads to an increased stray field immunity of the differential magnetic angle sensor system.

The most effective solution would be to avoid ferromagnetic materials for the shaft. This is not always possible, however, for example because of mechanical restrictions. Essentially three different concepts are therefore proposed herein in order to reduce or compensate for the inhomogeneous stray field components that occur when using a ferromagnetic shaft.

Figure 5A:
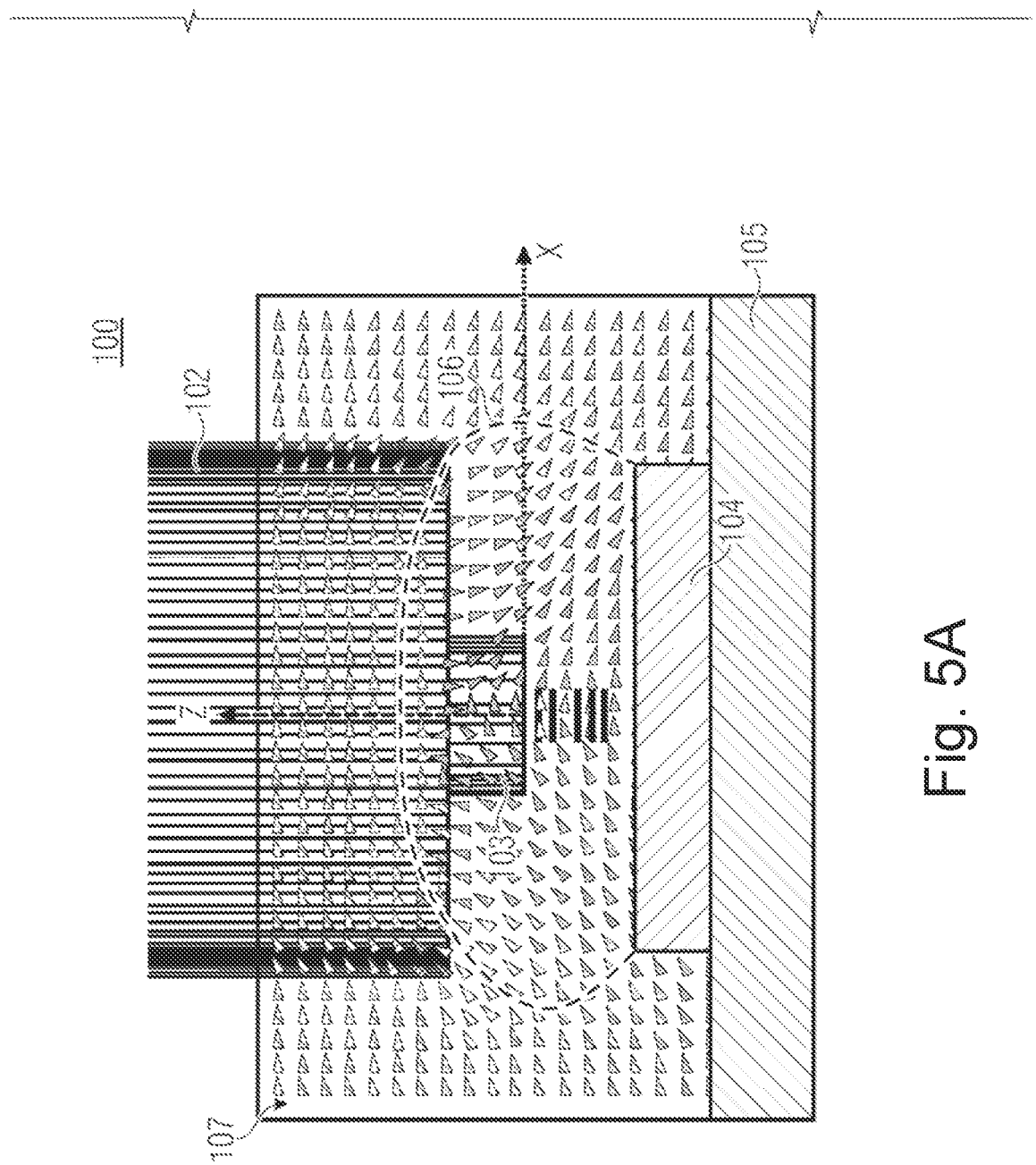
FIGS. 5A, 5B show a schematic side view of a ferromagnetic shaft and of a magnetic field sensor to illustrate the detection region of the magnetic field sensor.
Figure 5B:
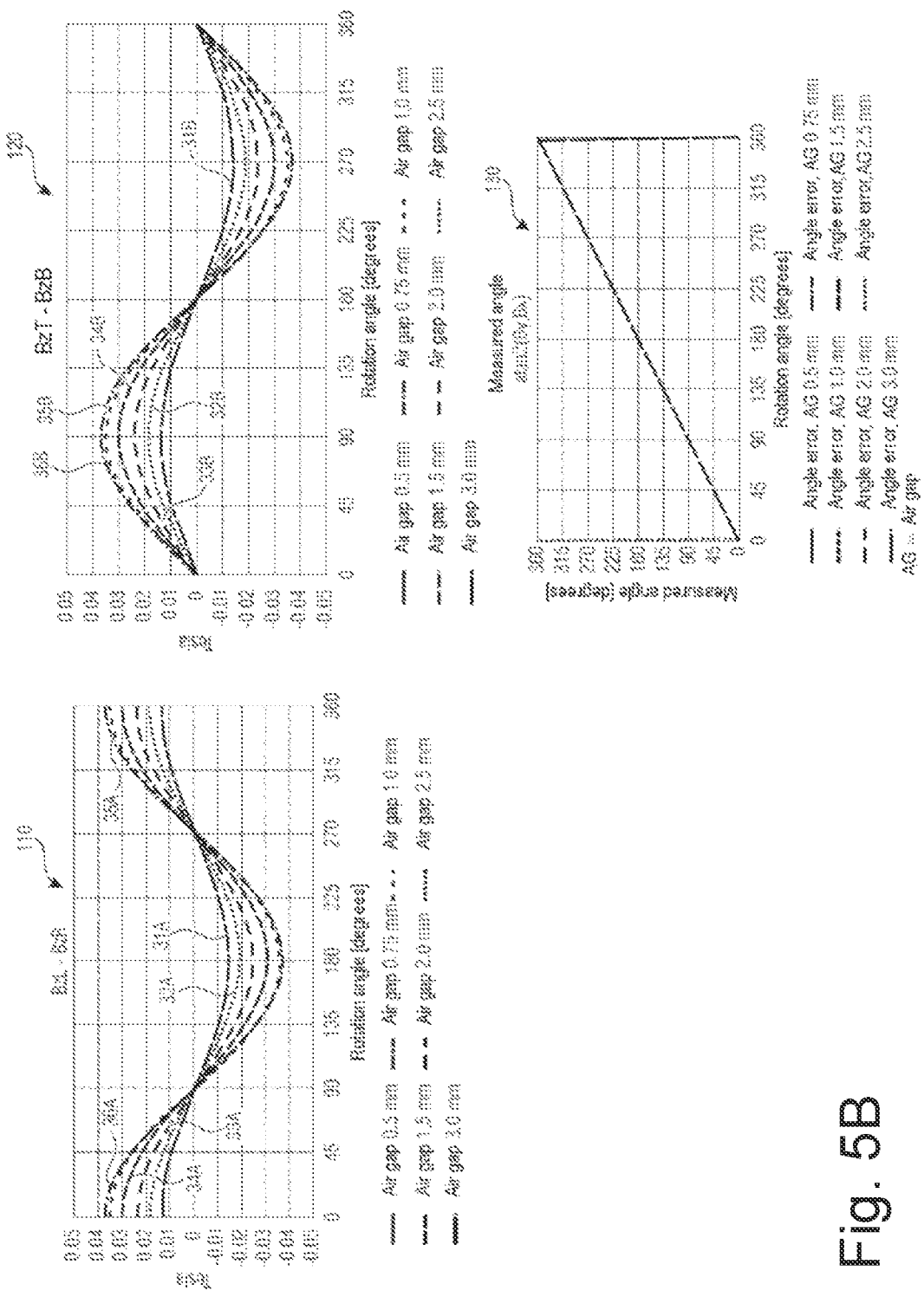

FIG. 5 shows by way of example a magnetic angle sensor system 100 according to the innovative concept described herein. The magnetic angle sensor system 100 comprises inter alia a rotatable shaft 102. The shaft 102 comprises a ferromagnetic material.

The magnetic angle sensor system 100 also comprises a permanent magnet 103 coupled, in particular coupled in movement, to the rotatable shaft 102. With reference to the following figures, a pair of examples of the way in which the coupling of the permanent magnet 103 to the rotatable shaft 102 may be implemented will be mentioned.

The magnetic angle sensor system 100 furthermore comprises a magnetic field sensor 104. The magnetic field sensor 104 may for example be arranged on a substrate 105, for example a PCB (printed circuit board). The magnetic field sensor 104 is arranged opposite the permanent magnet 103. The magnetic field sensor 104 may be arranged coaxially with the rotatable shaft 102.

The magnetic field sensor 104 comprises a detection region 106. In FIG. 5, this detection region 106 is indicated purely by way of example with dashed lines. The detection region 106 may of course in reality have a geometry and/or size other than those depicted purely by way of example here. In some implementations, however, the detection region 106 is configured in such a way that it detects a magnetic field generated by the permanent magnet 103. The magnetic field generated by the permanent magnet 103 is the magnetic field of interest in this application, since the magnetic angle sensor system 100 can determine the current rotation angle of the shaft 102 based on this magnetic field. The magnetic field generated by the permanent magnet 103 is therefore also referred to herein as a useful magnetic field. In FIG. 5, however, this useful magnetic field is not indicated for the sake of clarity.

As may be seen in FIG. 5, there is in this case an external homogeneous magnetic stray field 107, which is indicated by the magnetic field vectors depicted. Components of this stray field 107 likewise fall within the detection region 106 of the magnetic field sensor 104. As described above with reference to FIG. 4, the stray field 107 may have inhomogeneous stray field components because of the ferromagnetic material of the shaft 102. Due to the design of such magnetic angle sensor systems 100, these inhomogeneous stray field components in particular lie in the detection region 106 of the magnetic field sensor 104.

Accordingly, the magnetic field prevailing in the detection region 106 of the magnetic field sensor 104 is thus composed of the useful magnetic field of the permanent magnet 103 and an inhomogeneous stray field component of the otherwise homogeneous stray field 107.

In order to determine the current rotation angle of the shaft 102, the magnetic angle sensor system 100 may for example comprise a differentially measuring sensor technology as described above with reference to FIGS. 1A to 3. Accordingly, the magnetic field sensor 104 may be configured to generate, in response to the magnetic field detected in the detection region 106, at least two differential sensor signals 110, 120. Based on these differential sensor signals 110, 120, a rotation angle 130 of the shaft can be determined, for example by using the arctan function. Furthermore, homogeneous stray field components may be compensated for based on these at least two differential sensor signals 110, 120.

The inhomogeneous stray field components prevailing in the detection region 106 of the magnetic field sensor 104 (see the magnetic field vectors, which also extend in the positive or negative Z direction besides the X direction) cannot, however, be compensated for using the differentially measuring sensor technology. This leads to angle errors in the determination of the rotation angle 130 of the shaft 102. According to the innovative concept described herein, however, the magnetic angle sensor system 100 comprises means for reducing and/or compensating for the inhomogeneous stray field component. The form which these means may take will be explained in more detail below with reference to the following figures.

Figure 6:
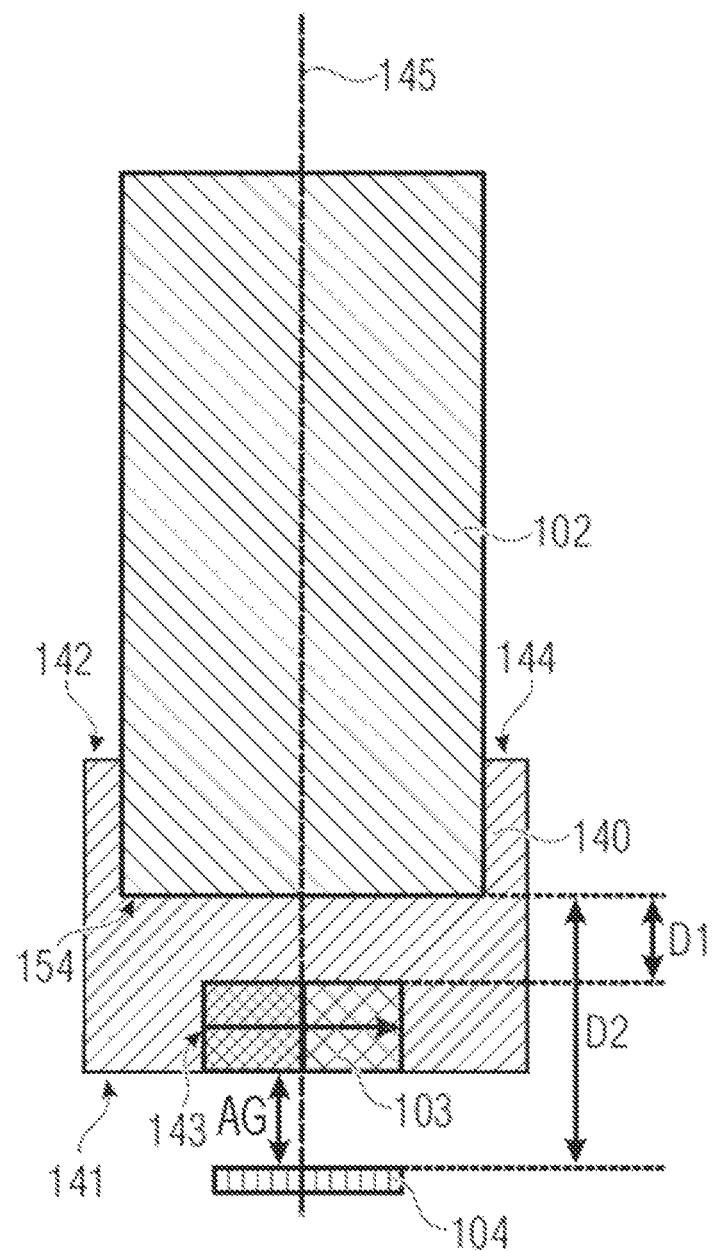
FIG. 6 shows a schematic side view of a magnetic angle sensor system with a spacer according to one example implementation.

FIG. 6 shows a first example implementation of such means 140 for reducing and/or compensating for the inhomogeneous stray field component. Here, the means for reducing and/or compensating for the inhomogeneous stray field component comprise a spacer 140 which is configured to arrange the permanent magnet 103 at a distance from and on the shaft 102.

As described with reference to FIG. 4, the stray field 107 has in particular homogeneous stray field components at a sufficient distance from the ferromagnetic shaft 102. The spacer 140 therefore provides a way of arranging the permanent magnet 103 at a certain distance D1 from the axial end 154 of the shaft 102, so that the permanent magnet 103 is placed closer to the region of the homogeneous stray field components. This has the advantage that the magnetic field sensor 104 can also be arranged at a certain distance D2 from the axial end 154 of the shaft 102, so that the magnetic field sensor 104 is also placed closer to the region of the homogeneous stray field components.

The advantage in this case is, in particular, that the air gap AG between the permanent magnet 103 and the magnetic field sensor 104 can still be kept very small. That is to say, if the permanent magnet 103 were left at the axial end 154 of the shaft 102 and only the magnetic field sensor 104 were arranged further away, in order to place it in the region of the homogeneous stray field components, the air gap AG would then also be increased. This, however, would lead to smaller signal aptitudes and larger angle errors (see FIGS. 2A to 2D).

The spacer 140, however, provides a solution for this problem by increasing the distance D1 of the permanent magnet 103 from the axial end 154 of the shaft 102, while simultaneously maintaining a small air gap AG between the permanent magnet 103 and the magnetic field sensor 104. In this way, the distance D2 of the magnetic field sensor 104 from the axial end 154 of the shaft 102 can be increased overall, so that the magnetic field sensor 104 is placed further away from the ferromagnetic shaft 102 and therefore in a region with primarily homogeneous stray field components. This means that the detection region 106 of the magnetic field sensor 104 primarily detects homogeneous stray field components, which can be compensated for using the differentially measuring sensor technology.

The spacer 140 may comprise, on a first side 141, a receiving section 143 in which the permanent magnet 103 can be arranged. On a second side 142 opposite the first side 141, the spacer 140 may comprise a fitting section 144 using which the spacer 140 is fitted on the shaft 102.

The receiving section 143 for the permanent magnet 103 may, for example, be configured in the form of a recess on the first side 141 of the spacer 140. The recess 143 may, for example, be as deep as the thickness (in the axial direction) of the permanent magnet 103. The permanent magnet 103 can therefore be inserted accurately into the recess 143, as is shown by way of example in FIG. 6.

The fitting section 144, with which the spacer 140 is fitted on the shaft 102, may be configured in the form of a recess 144 on the second side 142 of the spacer 140. This recess 144 may have a diameter which substantially has the same size as the diameter of the ferromagnetic shaft 102. The spacer 140 can therefore be fixed accurately on the shaft 102, for example with a press-fit.

If the spacer 140 comprises the aforementioned recesses 143, 144 on the first and second sides 141, 142, in terms of shape the spacer 140 resembles the letter H. This allows simple and therefore economical production of the spacer 140 in mass production.

The spacer 140 may preferably be connected rotationally fixed to the shaft 102, so that the spacer 140 co-rotates with the shaft 102. Furthermore, the permanent magnet 103 may preferably be arranged rotationally fixed in the spacer 140. The permanent magnet 103 is therefore coupled, in particular coupled in movement, to the shaft 102.

The shaft 102 has a rotation axis 145 (mid-axis of the shaft 102). Along this rotation axis 145, the spacer 140 is arranged using its fitting section 144 on an axial end section of the shaft 102. The permanent magnet 103 is arranged in the spacer 140 in such a way that the permanent magnet 103 is aligned coaxially with the shaft 102. This ensures smooth running without imbalance during the rotation of the shaft 102.

According to one example implementation, the spacer 140 may comprise a nonmagnetic material. This is advantageous insofar as a nonmagnetic material does not interfere with the magnetic field lines of the homogeneous stray field, that is to say spatial distortions do not occur as in the case of a ferromagnetic material (see FIG. 4).

It is furthermore conceivable for the spacer 140 to create a distance D1 of between 4 mm and 30 mm between the permanent magnet 103 and the shaft 102. In particular, the spacer 140 may create a distance of between 10 mm and 20 mm between the permanent magnet 103 and the shaft 102. The advantages in this regard will be described below with reference to FIGS. 7A to 7C.

Figure 7A:
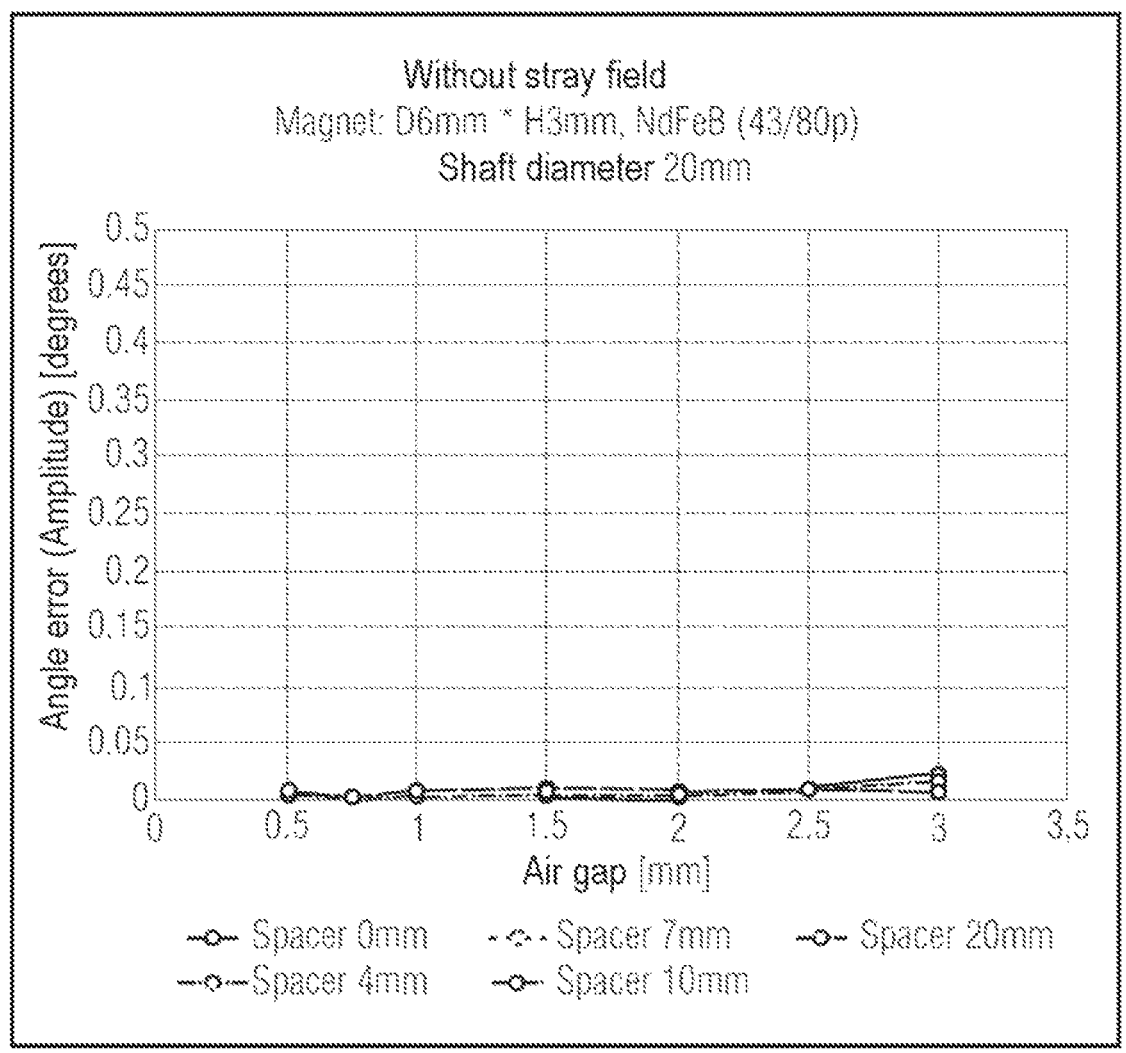
FIG. 7A shows a graph to illustrate the angle error of the example implementation of FIG. 6 with air gaps of different sizes and without the presence of an external homogeneous magnetic stray field.
Figure 7B:
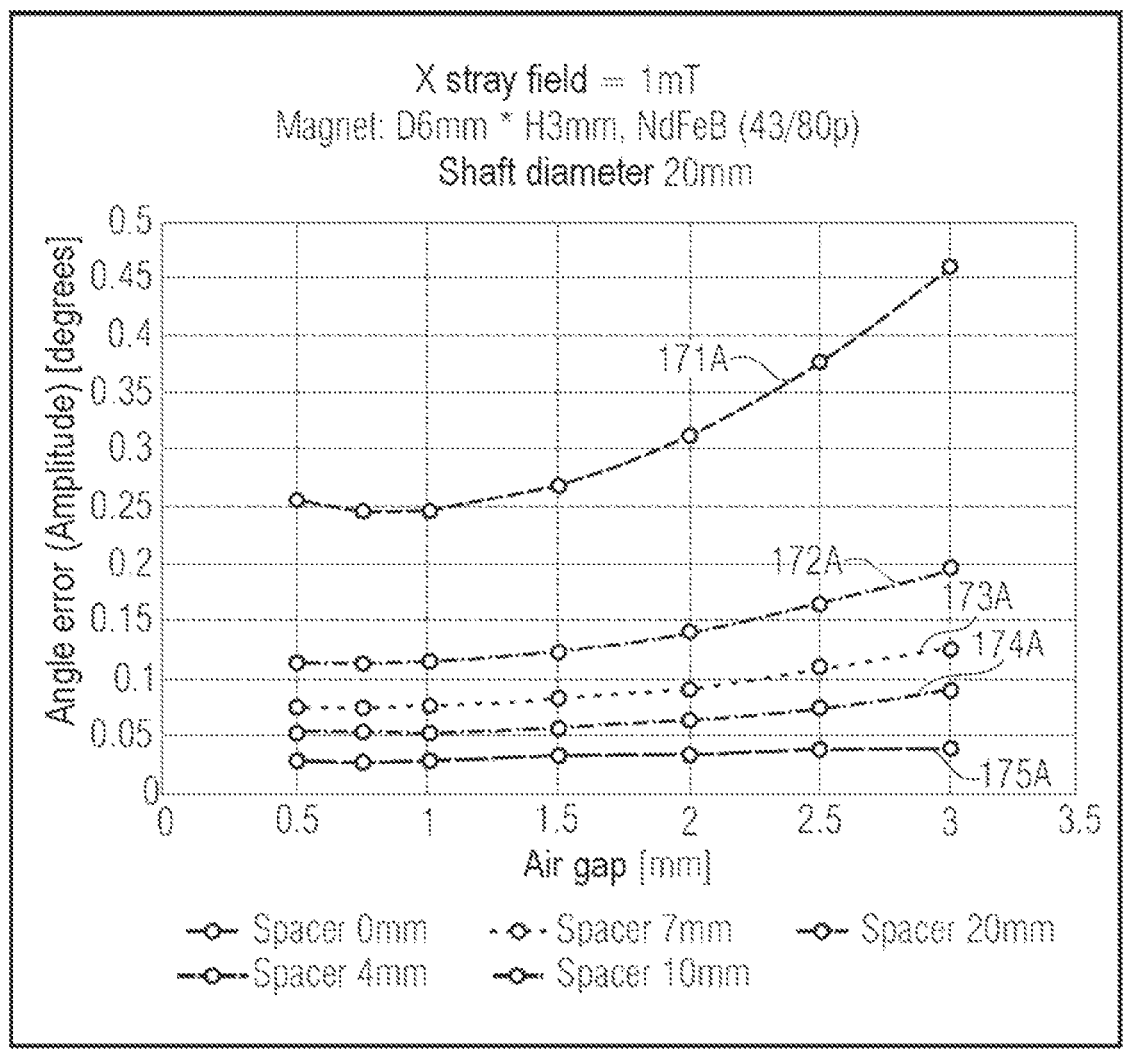
FIG. 7B shows a graph to illustrate the angle error of the example implementation of FIG. 6 with air gaps of different sizes and in the presence of an external homogeneous magnetic stray field with a magnitude of 1 mT.
Figure 7C:
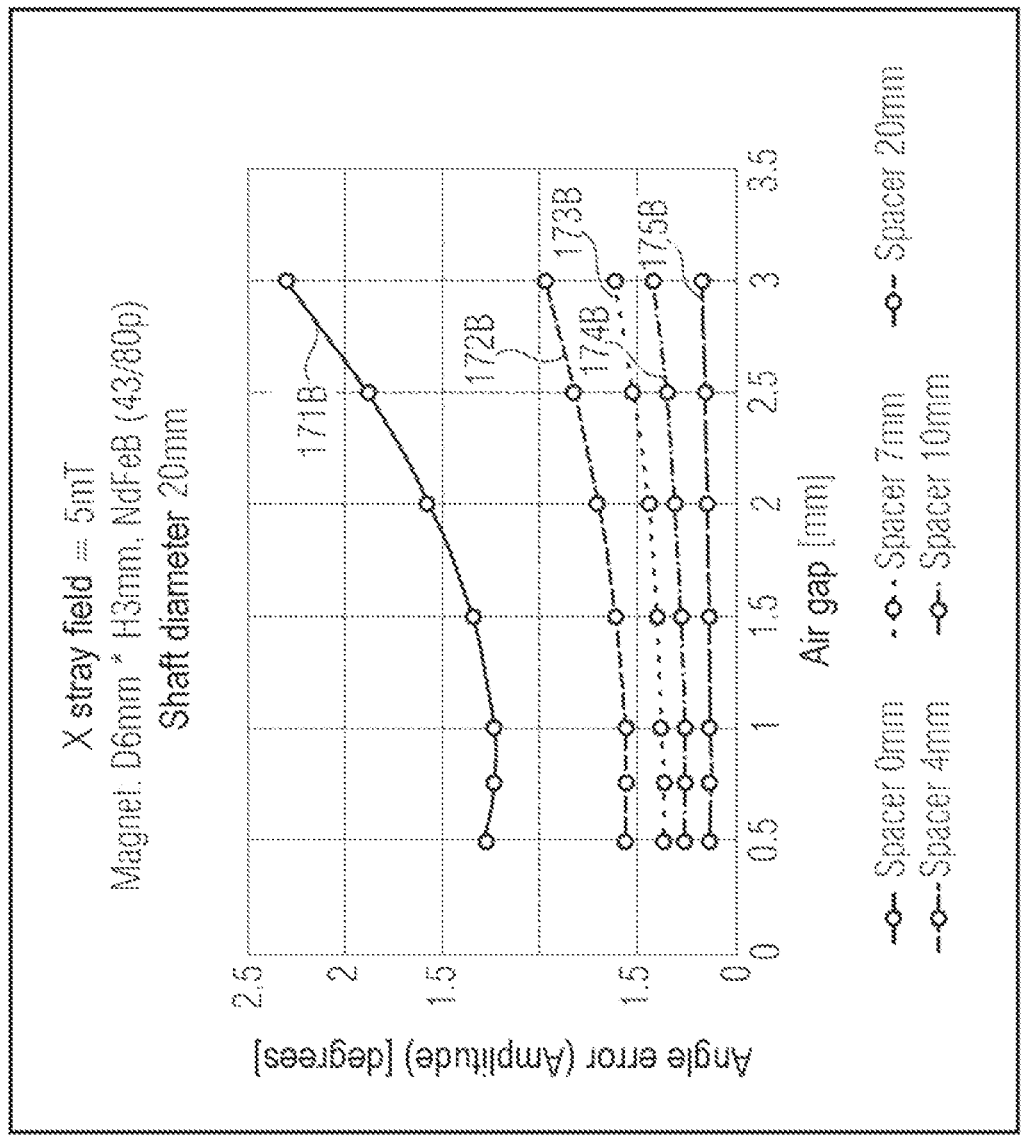
FIG. 7C shows a graph to illustrate the angle error of the example implementation of FIG. 6 with air gaps of different sizes and in the presence of an external homogeneous magnetic stray field with a magnitude of 5 mT.
Figure 7C:
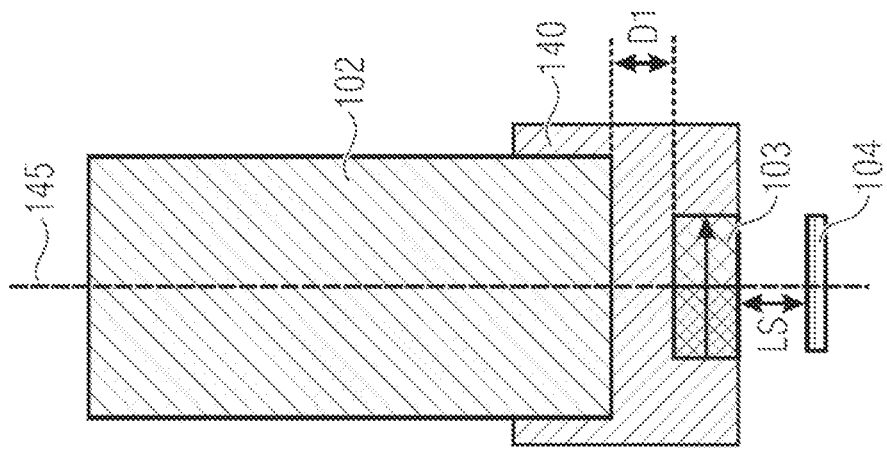

FIGS. 7A to 7C show graphical plots of simulations carried out with different air gaps and different thicknesses of the spacers 140. The thickness of a spacer 140 is measured in the axial direction, that is to say in the direction of the rotation axis 145. The simulations were carried out with the assumption of a ferromagnetic shaft 102 having a diameter of 20 mm and a permeability $\mu r$=4000. A diametrically magnetized disk with a diameter of 6 mm and a height of 3 mm is used as the permanent magnet 103. The remanence Br is 515 mT and the coercivity is −355 kA/m.

FIG. 7A shows a diagram in which the angle error with different air gaps AG is represented for differently thick spacers. The dimensions of the air gap between 0.5 mm and 3.0 mm are plotted on the X axis. The angle errors in degrees are plotted on the Y axis. The different curves in the diagram represent spacers with different thicknesses of between 0 mm (no spacer) and 20 mm. The plot depicted in FIG. 7A shows a scenario in which there is no stray field. Accordingly, the angle errors occurring in this case are small or negligible.

For the purpose of the simulation, a parameter study was carried out with different stray field amplitudes of between 0.1 mT and 5 mT, and the resulting angle errors were determined for a different spacer thickness d and different sensor air gaps AG. Purely by way of example, FIG. 7B shows a plot with an applied homogeneous stray field (in the X direction) with a simulated stray field amplitude of 1 mT, and FIG. 7C purely by way of example shows a plot with an applied homogeneous stray field (in the X direction) with a simulated stray field amplitude of 5 mT.

The curves 171A, 171B with a spacer thickness of 0 mm (no spacer) have as expected the greatest angle error. As may be seen with the aid of the curves 172A, 172B, a spacer thickness of only 4 mm is already sufficient to reduce the magnitude (amplitude) of the angle error significantly. With a spacer thickness of 7 mm, the curves 173A, 173B flatten out even more.

With a spacer thickness in a range of between 10 mm and 20 mm, the positive effects of the spacer 140 can be seen most clearly. Here, it may be seen that the angle error becomes vanishingly small even with an increasingly large air gap. By increasing the spacer thickness, the effect of the stray fields, and in this case particularly the effect of the inhomogeneous stray field components caused by the ferromagnetic shaft 102, is thus reduced and the measurement accuracy can be increased significantly.

The spacer 140 additionally has the effect that less permanent magnetic field is "absorbed" by the ferromagnetic shaft 102. This means that the magnetic flux density available at the magnetic field sensor 104 is increased in the case in which a spacer 140 is used. A higher SNR reduces the angle error. Thus, a stronger permanent magnet could in principle also be used instead of a spacer 140. The spacer is, however, the more effective and more economical solution.

This is revealed by comparing the differential signal amplitudes for the setups with a spacer thickness of 10 mm and 20 mm (FIGS. 7B and 7C). Both setups lead to signal amplitude values of the same size, that is to say the permanent magnet 103 is already sufficiently far away from the ferromagnetic shaft 102. With these distances D1 (spacer thicknesses d), the shaft 102 no longer influences the available field at the sensor positions, that is to say the magnetic field in the detection region 106 of the magnetic field sensor 104. Nevertheless, the resulting angle error for a 20 mm spacer 140 is much less than for a 10 mm spacer (compare FIGS. 7B and 7C). This confirms that the improved angle accuracy is due not only to an increased magnetic field but also to a reduced stray field effect (=noise). In both cases (spacer 140 or stronger magnet), the SNR is improved.

Figure 8A:
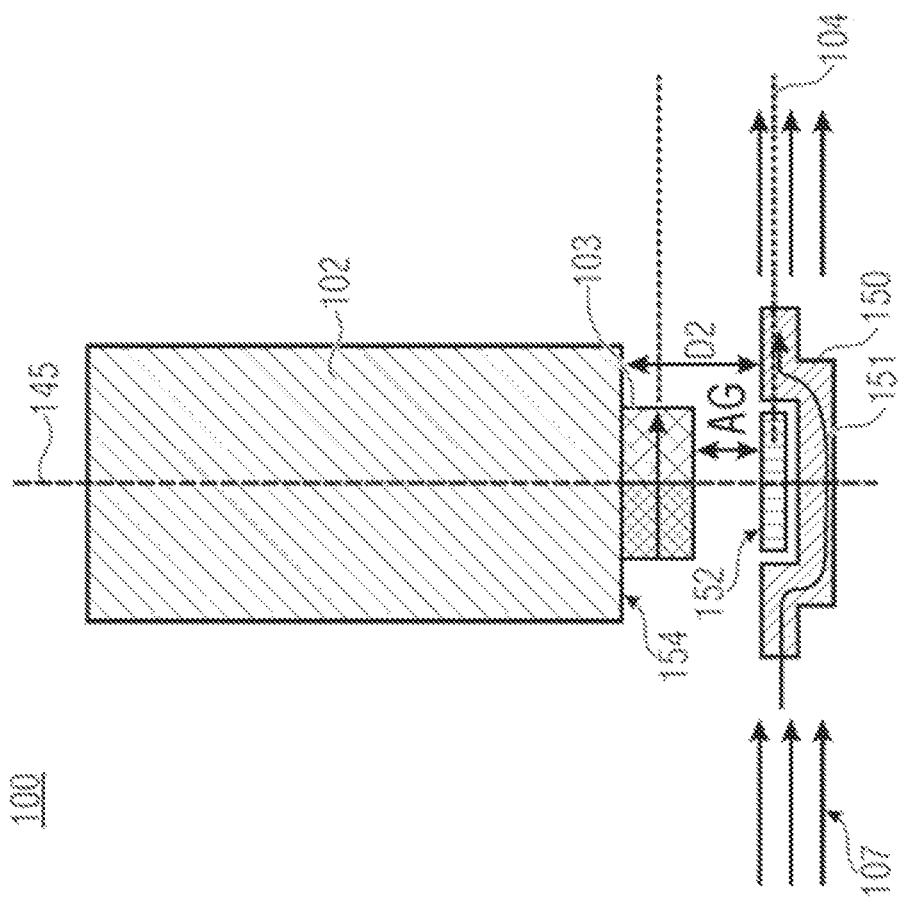
FIGS. 8A, 8B show a schematic side view of a magnetic angle sensor system with an external holding device according to one example implementation.
Figure 8B:
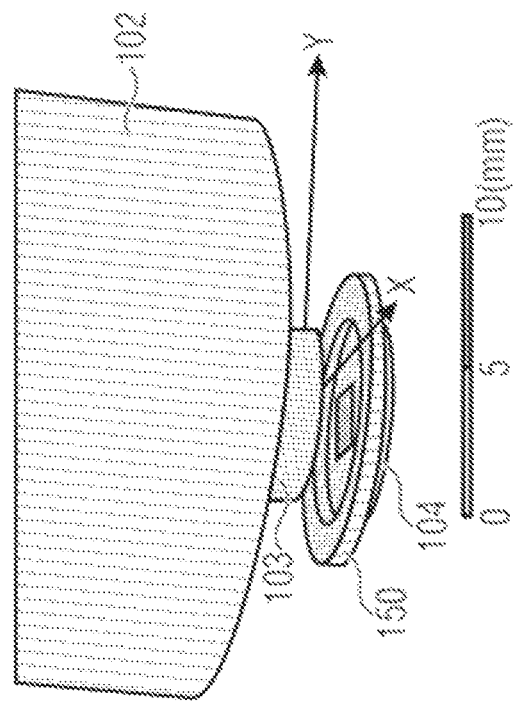

FIGS. 8A and 8B show a further example implementation of a magnetic angle sensor system 100 having corresponding means for reducing and/or compensating for the inhomogeneous stray field component according to the innovative concept described herein.

Here, the means for reducing and/or compensating for the inhomogeneous stray field component comprise a holding device 150. The holding device 150 is stationary relative to the rotatable shaft 102, that is to say the holding device 150 does not rotate with the shaft 102.

The magnetic field sensor 104 is arranged on or in the holding device 150. For example, the holding device 150 may comprise a recess 152 inside which the magnetic field sensor 104 can be arranged. The recess 152 in the holding device 150 may, for example, be as deep as the thickness (in the axial direction) of the magnetic field sensor 104. The magnetic field sensor 104 can therefore be inserted accurately into the recess 152, as is shown by way of example in FIGS. 8A and 8B.

The holding device 150 may be arranged opposite an axial end 154 of the shaft 102, in particular where the permanent magnet 103 is arranged. The holding device 150 may be arranged relative to the shaft 102 in such a way that the recess 152 together with the magnetic field sensor 104 arranged therein lies opposite the permanent magnet 103.

Furthermore, the holding device 150 is arranged coaxially with the shaft 102, that is to say the rotation axis 145 of the shaft 102 also extends through the holding device 150. For example, the rotation axis 145 may extend through the recess 152, and therefore also through the magnetic field sensor 104 arranged therein, so that the magnetic field sensor 104 arranged in the holding device 150 lies opposite the permanent magnet 103.

In order to avoid damage during the rotation of the shaft 102, the holding device 150 is arranged at a certain distance D2 from the shaft 102. This furthermore has the advantage that the magnetic field sensor 104 arranged in the holding device 150 is distanced further from the axial end 154 of the shaft 102, so that the magnetic field sensor 104 can be arranged in a region with a primarily homogeneous stray field component (cf. FIG. 4).

In addition, the holding device 150 may comprise a soft magnetic or ferromagnetic material. Likewise, as described above with reference to FIG. 4 for a ferromagnetic shaft 102, the magnetic field lines of the external homogeneous magnetic stray field 107 may also penetrate into the holding device 150. The penetrating field lines in this case extend inside the holding device 150, or through the holding device 150. As may be seen in FIG. 8A, this has the advantage that the penetrating magnetic field lines are guided past the recess 152 and therefore past the magnetic field sensor 104 arranged therein (see the schematically indicated magnetic field line 151).

The field lines 151 are thus, similarly as in the case of the shaft 102, "attracted" into the holding device 150 because of the ferromagnetic (=soft magnetic) material and thereby guided past the magnetic field sensor 104. This applies both for the homogeneous and for the inhomogeneous stray field component of the per se homogeneous stray field 107. This means that the inhomogeneous stray field component, which cannot be compensated for using the differentially measuring sensor technology and would therefore lead to measurement errors, is guided through the holding device 150 and therefore guided past the magnetic field sensor 104, so that this inhomogeneous stray field component does not interfere with the measurement results of the magnetic field sensor 104. The inhomogeneous stray field component can therefore be reduced or compensated for using the holding device 150.

The holding device 150 thus causes a deviation of the stray field, and in particular a deviation of the homogeneous and inhomogeneous stray field components. The holding device 150 hence acts as a kind of magnetic pole and may therefore also be referred to as a pole piece or flux conducting platelet. The magnetic field sensor 104 may be placed in the interior of the recess 152 of the pole piece 150. The pole piece 150 engages with the stray field 107 and deviates it out from the sensor plane.

FIG. 8B shows a measurement structure such as was used for a simulation in order to assess the effectiveness of the pole piece or the holding device 150. The parameters correspond to those of FIGS. 7A and 7B, that is to say a ferromagnetic shaft 102 having a diameter of 20 mm and a permeability µr=4000 is assumed. A diametrically magnetized disk with a diameter of 6 mm and a height of 3 mm is used as the permanent magnet 103. The remanence Br is 515 mT and the coercivity is −355 kA/m. The permanent magnet 103 is arranged directly on the axial end 154 of the shaft 102, that is to say no spacer 140 (see FIG. 6) is arranged between the permanent magnet 103 and the shaft 102. According to one example implementation, however, it is naturally conceivable for the pole piece or holding device 150 to be combined with the spacer 140.

In the setup shown in FIGS. 8A and 8B, an air gap AG of 1.5 mm is simulated. According to FIG. 7C, without a spacer 140 with an air gap of 1.5 mm an angle error of 1.3° is expected. Because of the holding device 150, which deviates the stray field and guides it past the magnetic field sensor 104, the angle error may however be reduced significantly.

Figure 9A:
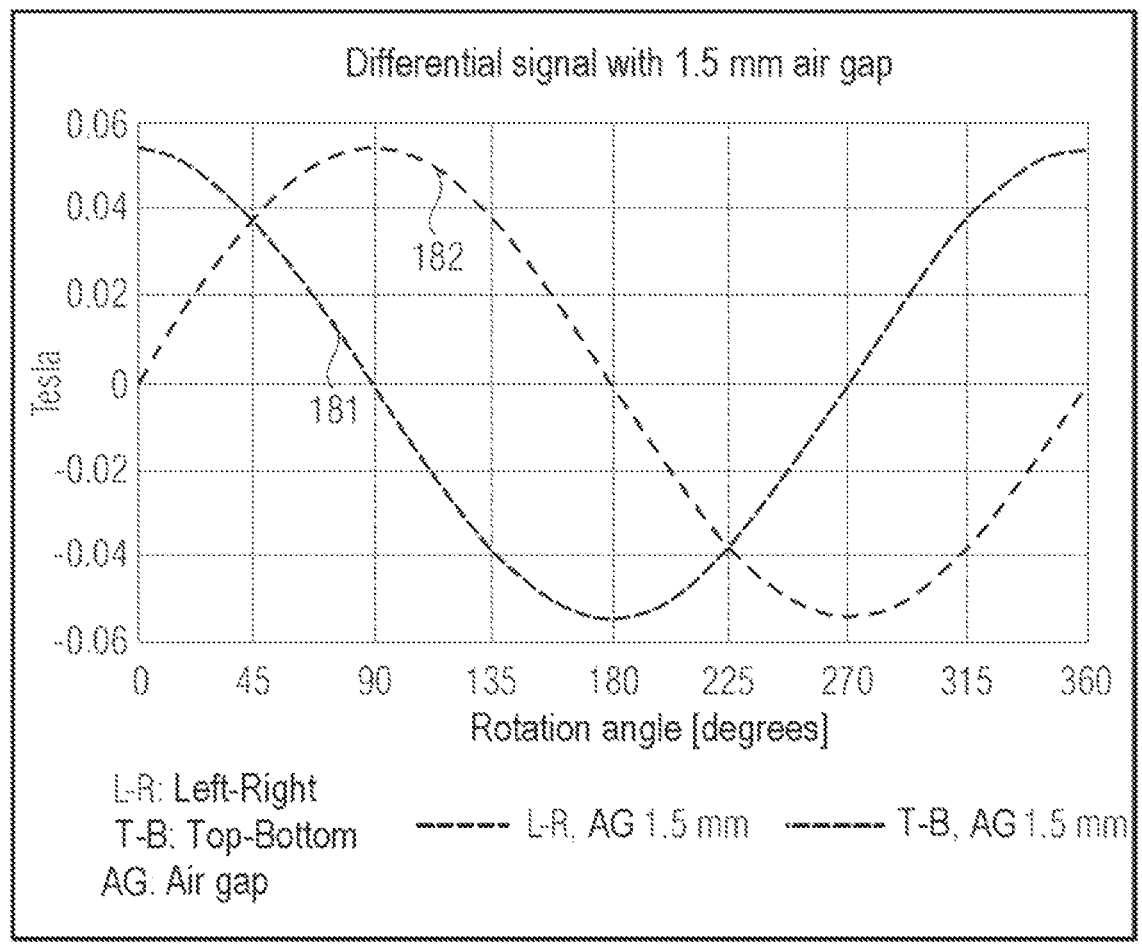
FIG. 9A shows a graph to illustrate the differential signals of the example implementation of FIGS. 8A and 8B with an air gap of 1.5 mm and in the presence of an external homogeneous magnetic stray field.
Figure 9B:
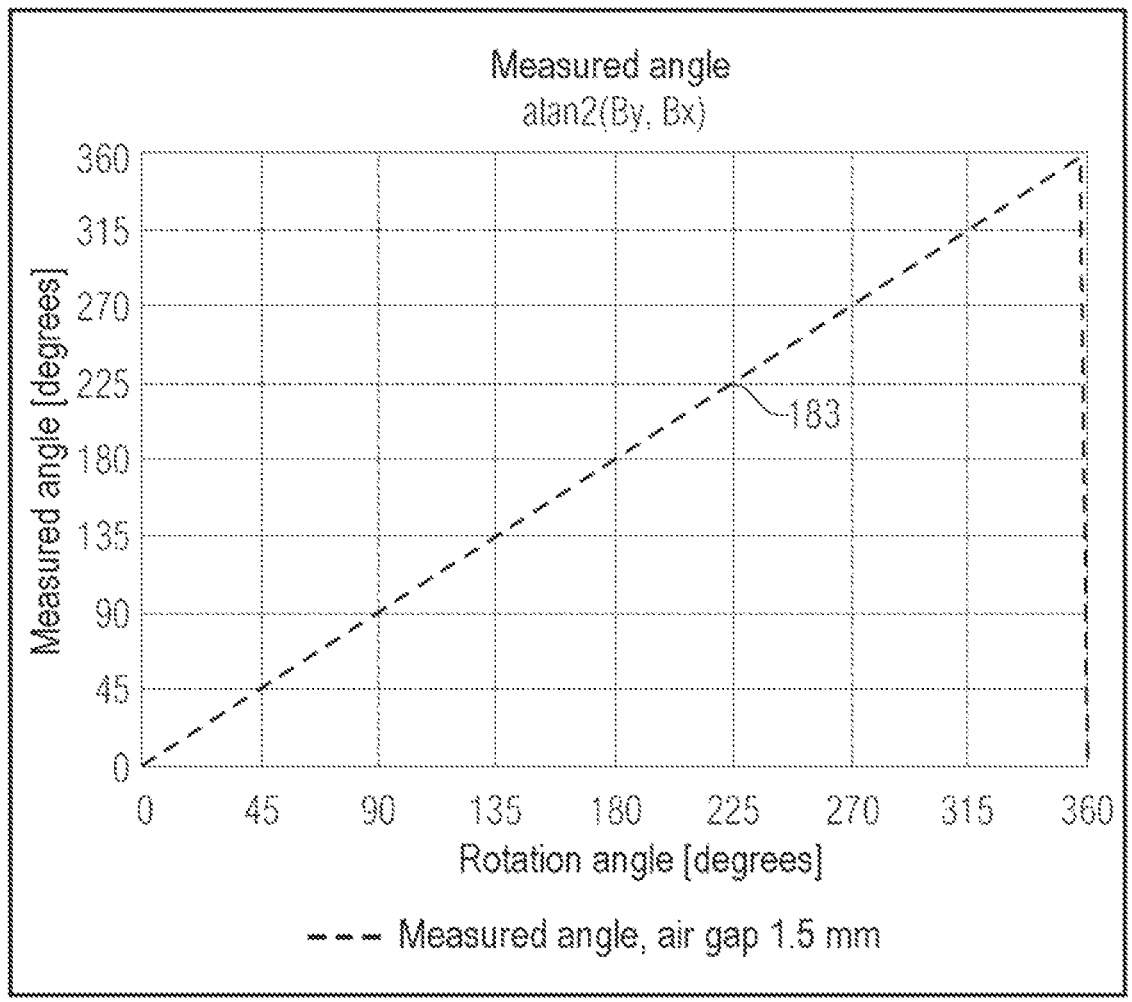
FIG. 9B shows a graph to illustrate the calculation of the rotation angle based on the differential signals of FIG. 9A.
Figure 9C:
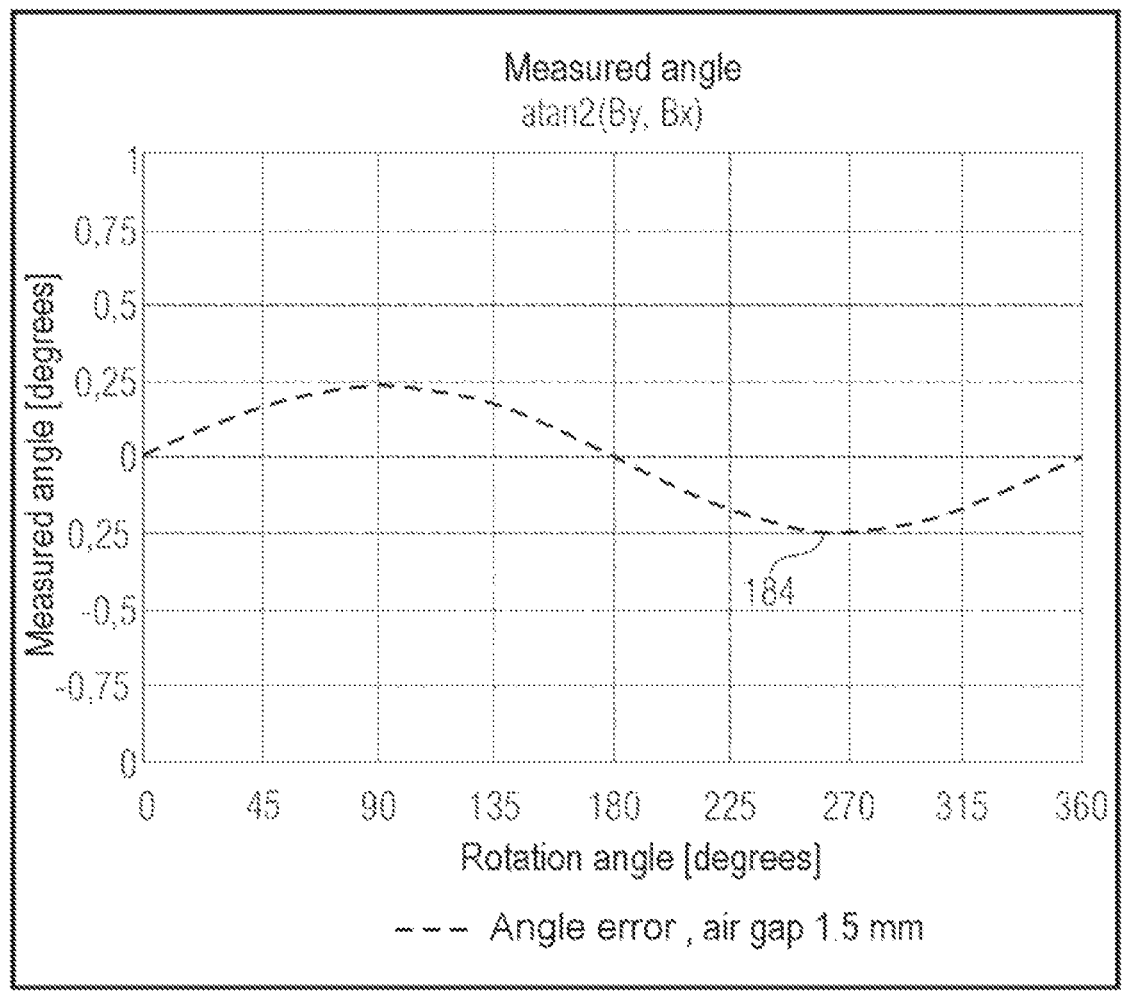
FIG. 9C shows a graph to illustrate the angle error of the magnetic angle sensor system according to FIGS. 8A and 8B.

The results of the simulation carried out with the measurement structure according to FIG. 8B are shown in FIGS. 9A to 9C. FIG. 9A shows the corresponding differential signals such as may be determined by the differentially measuring sensor technology. The curve 181 in this case depicts the signal (BzL−BzR) determined using a first Hall plate pair. The curve 182 depicts the signal (BzT−BzB) determined using the second Hall plate pair. As already mentioned in the introduction with reference to FIG. 1B, the Hall plate pairs are mentioned here merely as a nonlimiting example of the implementation of a differentially measuring sensor technology. As an alternative to the Hall plates, other magnetoresistive sensor elements, for example xMR (AMR, GMR, TMR), may also be used for the innovative magnetic angle sensor system 100 described herein.

FIG. 9B shows the rotation angle 183 of the shaft 102, which can be calculated from the two differential signals 181, 182, for example using the arctan function.

FIG. 9C shows the angle error 184 determined. As may be seen, an angle error of about 0.24 degrees is found. It is much less than the angle error of 1.3 degrees to be expected from FIG. 7C with an air gap of 1.5 mm. This shows that the holding device 150 can effectively reduce or compensate for the inhomogeneous stray field component.

The example implementations discussed so far with reference to FIGS. 6 to 9C may be implemented both with a diametrically magnetized permanent magnet and with an axially magnetized permanent magnet, and in particular with a bipolarly axially magnetized permanent magnet. The magnetization direction describes the course of the magnetic axis inside the permanent magnet, at the end of which the poles are located. The terms diametrically and axially as mentioned herein refer in this case to the rotation axis 145 of the shaft 102. The magnetization direction or magnetic axis is represented using an arrow in the respective figures.

Thus, for example, a diametrically magnetized permanent magnet 103 is depicted in FIGS. 6 and 8A, which is symbolized by the arrow extending from left to right. The two poles of the permanent magnet 103 are arranged opposite one another in the arrow direction. The arrow symbolizes the magnetic axis, which accordingly extends diametrically, e.g., perpendicularly to the rotation axis 145 of the shaft.

An axially magnetized permanent magnet which may likewise be used in the implementations discussed so far, and in particular a bipolarly axially magnetized permanent magnet, will be described in more detail below with reference to FIGS. 10A to 10C.

Figure 10A:
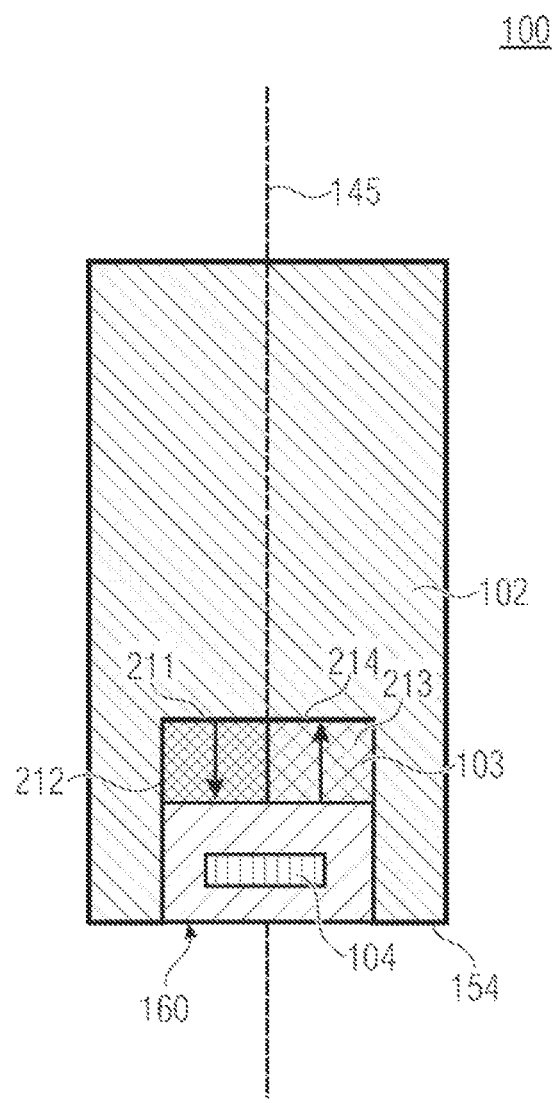
FIG. 10A shows a schematic side view of a magnetic angle sensor system with, provided in the shaft, a bore in which the permanent magnet and the magnetic field sensor are arranged, according to one example implementation.
Figure 10B:
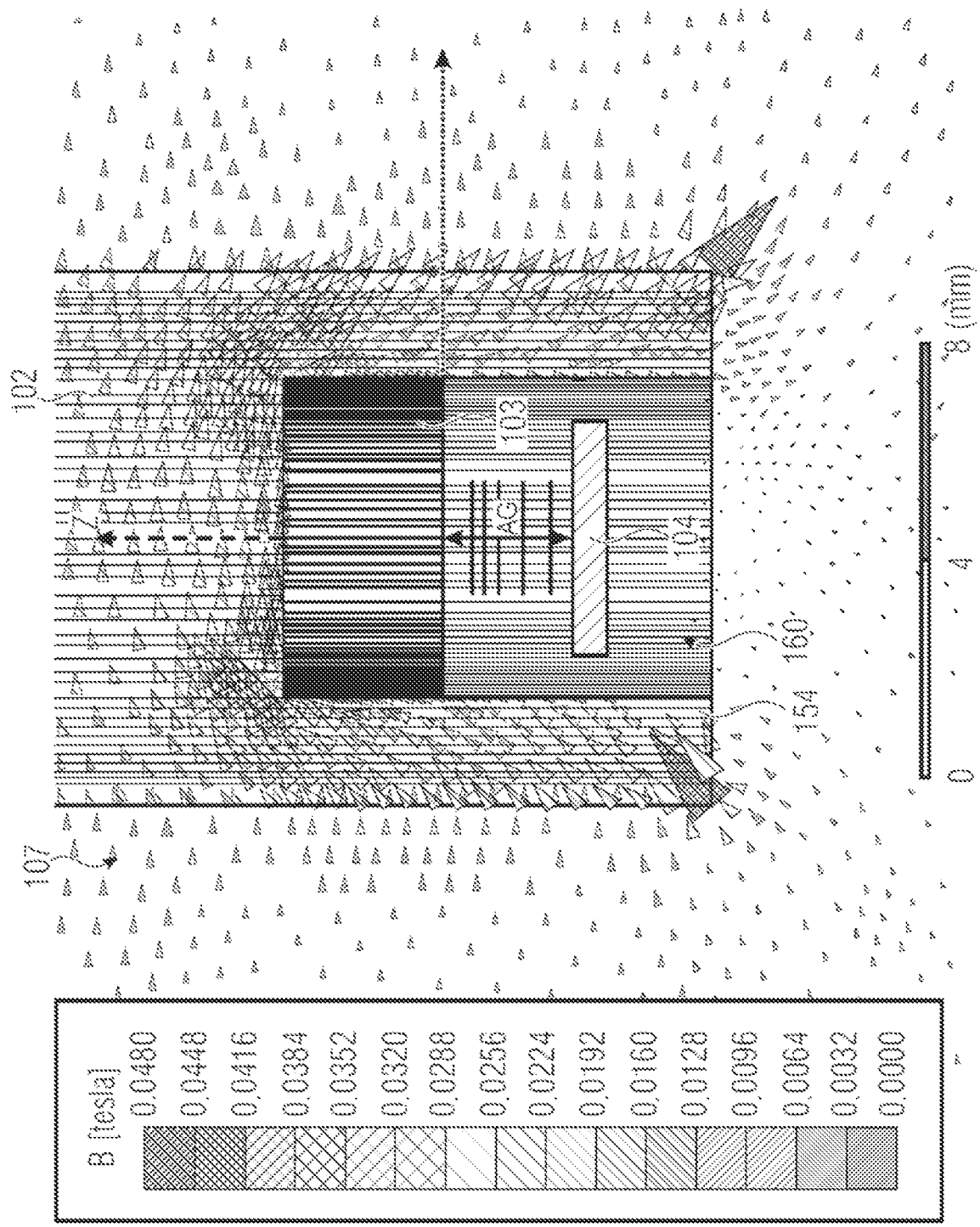
FIG. 10B shows a schematic side view of the shaft of FIG. 10A with additionally represented magnetic field lines of an external homogeneous magnetic stray field.
Figure 10C:
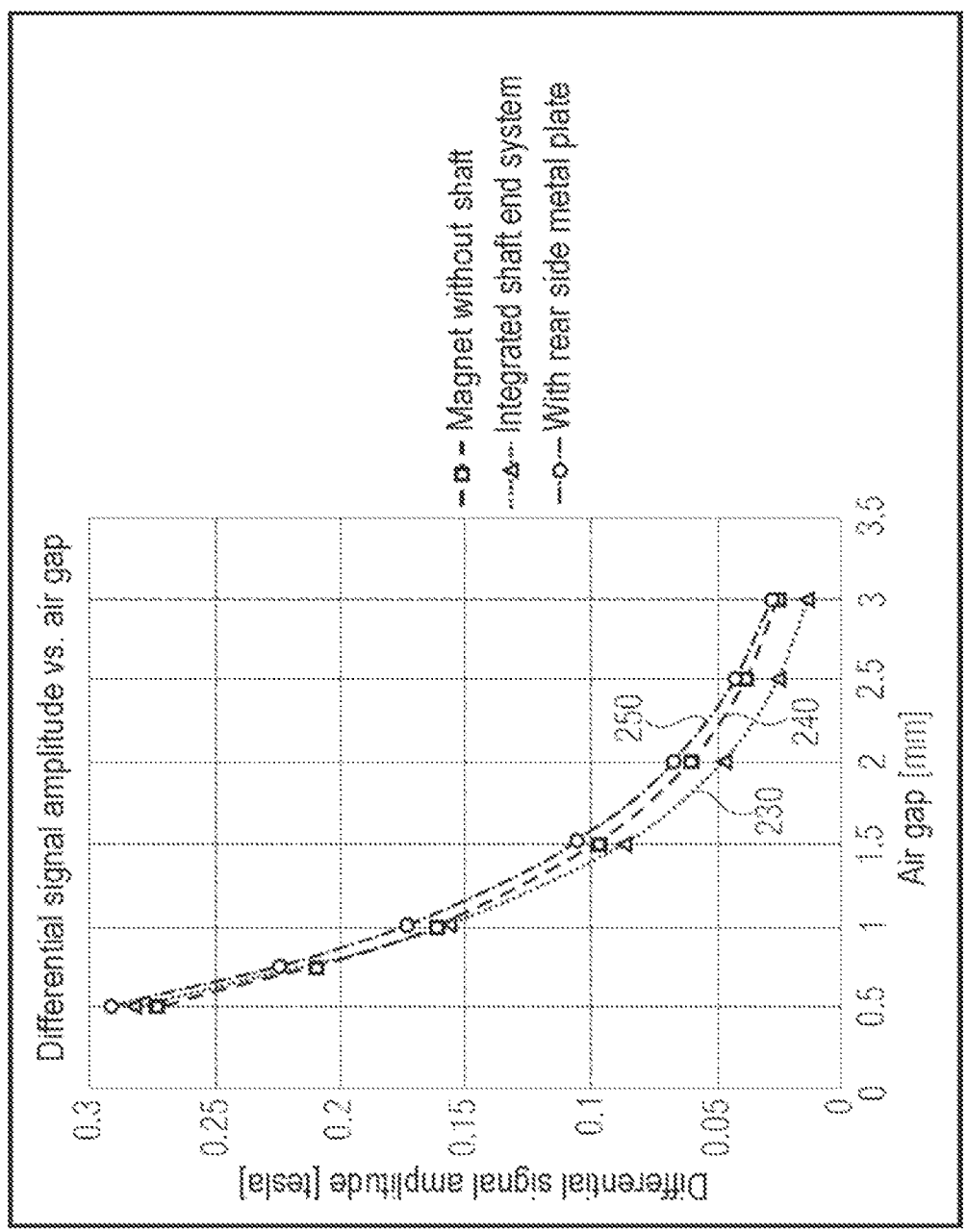
FIG. 10C shows a graph to illustrate the improved signal amplitudes because of the arrangement of the permanent magnet and the magnetic field sensor in the bore.
Figure 10C:
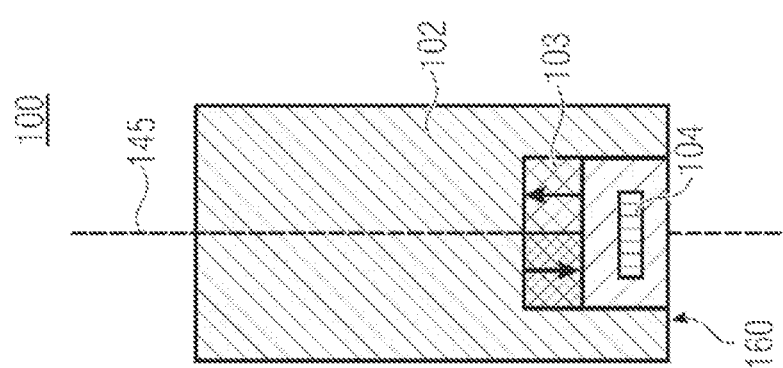

FIGS. 10A to 10C show a further example implementation of a magnetic angle sensor system 100 having corresponding means for reducing and/or compensating for the inhomogeneous stray field component according to the innovative concept described herein.

Here, the means for reducing and/or compensating for the inhomogeneous stray field component comprise a bore 160 inside the shaft 102. This bore 160 extends along the shaft longitudinal axis or rotation axis 145 starting from an axial end section 154 of the shaft 102. That is to say, the bore 160 extends into the shaft 102 from the axial end section 154 of the shaft 102.

The permanent magnet 103 may be arranged inside this bore 160. The permanent magnet 103 may in this case be arranged rotationally fixed to the shaft 102 so that the permanent magnet 103 co-rotates with the shaft 102. Optionally, the magnetic field sensor 104 may additionally be arranged in the bore 160. The magnetic field sensor 104 may in this case be stationary relative to the shaft 102 so that the magnetic field sensor 104 does not co-rotate with the shaft 102. The magnetic field sensor 104 may therefore also be stationary relative to the permanent magnet 103, so that the permanent magnet 103 co-rotates together with the shaft 102 while the permanent magnet 103 and the shaft 102 rotate together relative to the stationary magnetic field sensor 104.

The permanent magnet 103 may be arranged entirely inside the bore 160. The magnetic field sensor 104 may also be arranged entirely inside the bore 160. Accordingly, the magnetic field sensor 104 may, as seen in the axial direction, be arranged between the permanent magnet 103 and the axial end section 154 of the shaft 102.

The bore 160 may be configured as a blind hole, as is shown by way of example in FIG. 10A. The permanent magnet 103 may be arranged at the end of the blind hole 160. This has the advantage that the ferromagnetic material of the shaft 102 on the rear side of the permanent magnet 103 increases the useful magnetic field of the permanent magnet 103, so that a significantly greater useful magnetic field is available for the magnetic field sensor 104 in order to determine the rotation angle.

The bore 160 may have a diameter which corresponds approximately to the diameter of the permanent magnet 103. The permanent magnet 103 may therefore be inserted accurately into the bore 160.

As may be seen particularly in FIG. 10B, the bore 160 acts as a kind of shield of the magnetic field sensor 104 against the stray field 107, and in particular against the inhomogeneous stray field components. As explained with reference to FIG. 4, the ferromagnetic shaft 102 attracts the magnetic field lines of the stray field 107. The magnetic field lines are in this case distributed inside the shaft 102. They do not enter the bore 160, however, so that the permanent magnet 103 arranged inside the bore 160 and the magnetic field sensor 104 are protected or shielded against the stray field.

FIG. 10B essentially shows the stray field distribution in an XZ cross section of a magnetic angle sensor system 100 according to the innovative concept described herein with a bore 160 in the shaft 102. For representational purposes, the permanent magnet 103 is here again placed in a vacuum so that only the external stray field 107, which is applied in the X direction (5 mT), can be seen. The ferromagnetic shaft 102 deflects the field lines of the homogeneous stray field 107 and shields the magnetic field sensor 104 against the stray field 107.

As mentioned in the introduction, both the permanent magnet 103 and the magnetic field sensor 104 may be arranged entirely inside the bore 160, which leads to particularly good shielding. Since the permanent magnet 103 rotates relative to the magnetic field sensor 104, a sufficiently large air gap AG should here again be provided between the permanent magnet 103 and the magnetic field sensor 104. Owing to the fact that the ferromagnetic material of the shaft 102 increases the useful magnetic field of the permanent magnet 103, the air gap AG may be configured with a somewhat greater tolerance than in the two implementations discussed above.

In FIG. 10C, the useful magnetic field of the permanent magnet 103 arranged inside the bore 160 (curve 230) is compared with a permanent magnet on its own outside a shaft with a bore (curve 240) and with a permanent magnet having a ferromagnetic plate on the rear side (curve 250).

In the simulation according to the curve 250, the ferromagnetic plate increases the useful magnetic field of the permanent magnet 103, which is available for the sensor side. This is therefore comparable to an arrangement in which the permanent magnet 103 is arranged at the end of the bore 160 configured as a blind hole and is in contact with the shaft 102 there. Here, the inwardly offset shaft end, on which the permanent magnet 103 bears, serves as an amplifier of the useful magnetic field. This means that the ferromagnetic shaft 102 has a similar effect to the simulated ferromagnetic plate on the rear side of the permanent magnet (see curve 250).

As may be seen in FIG. 10C, the configuration with field amplification (curve 250) shows the highest field amplitudes. The ferromagnetic material on the rear side of the permanent magnet 103 amplifies the useful magnetic field which is available for the sensor 104. The ferromagnetic side walls of the bore 160 absorb a certain proportion of this magnetic field, however. In the case of small air gaps of up to about 0.75 mm, the magnetic field sensor 104 therefore benefits from the amplified useful magnetic field due to the ferromagnetic material on the rear side of the permanent magnet 103 (curve 250). With air gaps becoming larger, however, the ferromagnetic side walls become dominant (curve 230). These reduce the useful magnetic field a little, compared with the permanent magnet on its own (curve 240).

EXAMPLES

In all examples discussed here for the simulations carried out, the same magnet dimensions and materials were used. Very large differential signals are therefore obtained for the purpose of clear visualization. In principle, a weaker magnetic material (for example isotropic ferrite with a remanence Br=230 mT) would also deliver sufficiently large fields for the sensor.

The permanent magnet 103 arranged inside the bore 160 may be an axially magnetized cylinder with a north pole and a south pole on the lower side. This may in particular be a bipolarly axially magnetized permanent magnet.

As may be seen in FIGS. 10A and 10C, the permanent magnet 103 may comprise a first pole pair 211, 212 in a left half. The first pole pair 211, 212 may comprise two opposite magnetic poles 211, 212 arranged above one another in the axial direction. The magnetic flux direction or the magnetic axis extends axially, that is to say parallel to the rotation axis 145 of the shaft, which is indicated by the arrow (extending from top to bottom) shown in the left half of the permanent magnet 103.

In a right half, the permanent magnet 103 may comprise a second pole pair 213, 214. The second pole pair 213, 214 may likewise comprise two opposite magnetic poles 213, 214 arranged above one another in the axial direction. The magnetic flux direction or the magnetic axis extends axially, that is to say parallel to the rotation axis 145 of the shaft, which is indicated by the arrow (extending from bottom to top) shown in the right half of the permanent magnet 103.

The two magnetic poles 211, 212 of the first pole pair are arranged mirror-symmetrically with respect to the two magnetic poles 213, 214 of the second pole pair. For example, in the first pole pair a north pole may be arranged at the top (as seen in the axial direction) and a south pole may be arranged at the bottom, in which case a south pole would be arranged at the top and a north pole at the bottom in the second pole pair. The effect of this is that although the magnetic axes of the two pole pairs both extend axially, they do so in the opposite direction. This is therefore a bipolarly axially magnetized permanent magnet.

The advantage of such a bipolarly axially magnetized permanent magnet is that it is significantly more economical in comparison with ring magnets.

The innovative concept described herein will be briefly summarized again below in other terms:

The present concept relates to magnetic end-of-shaft angle sensor systems. For such applications, diametrically magnetized disk magnets are conventionally fitted on a shaft end. A magnetic field sensor is fastened coaxially at a particular distance from the magnet. Magnetic field sensors are, however, susceptible to external magnetic stray fields.

Normally, a homogeneous stray field can be compensated for using a differential measurement. In that case, with a homogeneous stray field, the same component (magnitude and direction) of the undesired stray field acts on both sides (top/bottom and left/right).

In the case of ferromagnetic shafts, however, spatial distortions of the (intrinsically) homogeneous stray field occur, that is to say by distortion of the stray field in the shaft the intrinsically homogeneous stray field then becomes partially inhomogeneous. For example, the field vectors point upward when entering the shaft and downward when emerging from the shaft. This means that the vectors have different signs on the left and right. The (partially inhomogeneous) stray field therefore cannot be compensated for accurately enough with the differential measurement alone, since for the purpose of the compensation using differential measurement there would have to be an entirely homogeneous magnetic field that has the same magnetic field components (magnitude and direction) on both sides (left/right and top/bottom).

Despite the differential measurement principle, stray fields cannot be compensated for entirely since uncompensatable inhomogeneous components remain, which are superimposed on the useful magnetic field of the permanent magnet and thus lead to measurement errors in the sensor.

The present concept now attempts to compensate for these inhomogeneous components so that these inhomogeneous components are no longer superimposed on the useful magnetic field of the permanent magnet and the sensor can therefore measure just the actual magnetic field of the permanent magnet. The homogeneous components of the stray field may in this case still be compensated for by the differential measurement.

With this concept, in particular three magnetic circuit concepts are proposed in order to increase the immunity of differential magnetic sensors against stray fields.

In a first example implementation, it is proposed to provide a nonmagnetic spacer 140 between the permanent magnet 103 and the shaft 102. The addition of a nonmagnetic spacer 140 between the magnet 103 and the ferromagnetic shaft 102 improves the stray field robustness dramatically. By addition of this spacer 140, the sensor 104 and the magnet 103 are moved further away from the ferromagnetic shaft 102 and the effect of the stray field 107 is therefore reduced. That is to say, the distance D2 between the shaft 102 and the sensor 104 is increased. Stray fields 107, which are deflected and distorted by the ferromagnetic shaft 102, therefore influence the sensor signals much less. This spacer 140 may fulfill the function of a holder for the permanent magnet 103 in order to arrange the latter at a distance from and on the shaft 102. The cross section of the spacer 140 may be shaped like the letter "H", in which case one end may be applied over the shaft 102 while the other end is used as a holder for the magnet 103. This allows robust fixing of the magnet 103 on the shaft 102. The spacer 140 may, however, have different shapes. For example, the spacer 140 may be configured in the form of a solid disk. In each case, the spacer 140 allows robust and accurate fitting of the magnet 103 on the shaft 102.

In a second example implementation, a ferromagnetic holding device 150 or a ferromagnetic pole piece may be provided. The pole piece 150 may be shaped like a soup dish, in which case the magnetic field sensor 104 may be arranged in the middle. The sensor chip 104 may, for example, be placed inside a recess 152 in the pole piece 150. The ferromagnetic pole piece 150 can act as a deviation for the stray fields. The pole piece 250 deviates the stray field 107 and therefore diverts the stray field 107 away from the sensor chip 104, or out from the sensor plane, so as to reduce the angle error.

In a third example implementation, a bore 160 can be provided inside the shaft 102, in which case the permanent magnet 103 and optionally also the magnetic field sensor 104 may be arranged inside this bore 160. In this case, an axially magnetized cylindrical or ring magnet having two poles each on one side of the permanent magnet 103 may be used. The magnet 103 may be integrated into the shaft 102. In this case, the ferromagnetic shaft 102 acts as a mirror for the magnet 103 and increases the useful magnetic field at the sensor position, that is to say in the detection region 106 of the magnetic field sensor 104. This is thus an integrated end-of-shaft solution, in which case the sensor 104 and the magnet 103 may be integrated in the interior of a bore 160 at the end 154 of the shaft 102. The magnet 103 may be an axially magnetized cylinder having two poles on one side. The ferromagnetic shaft 102 on the rear side of the magnet 103 assists an increase in the magnetic field at the sensor position. The shaft 102 itself acts as shielding against external fields.

The examples described above merely represent an illustration of the principles of the innovative concept described herein. It is to be understood that modifications and variations of the arrangements and details described herein will be clear to other persons skilled in the art. It is therefore intended that the concept described herein be restricted only by the protective scope of the appended patent claims and not by the specific details that have been presented herein with the aid of the description and the explanation of the examples.

Although many aspects have been described in connection with a device, it is to be understood that these aspects also represent a description of the corresponding method, so that a block or a component part of a device is also to be understood as a corresponding method step or as a feature of a method step. Similarly, aspects which have been described in connection with or as a method step also represent a description of a corresponding block or detail or feature of a corresponding device.

What is claimed is:

1. A magnetic angle sensor system comprising:
a rotatable shaft,
a permanent magnet coupled to the rotatable shaft,
a magnetic field sensor arranged opposite the permanent magnet, the magnetic field sensor being configured to detect a magnetic field prevailing in a detection region of the magnetic field sensor,
wherein the magnetic field sensor is configured to generate, based on detecting the magnetic field, at least two differential sensor signals with which homogeneous stray field components can be compensated for, and to determine a rotation angle of the rotatable shaft based on the at least two differential sensor signals,
wherein the rotatable shaft comprises a ferromagnetic material, the ferromagnetic material spatially distorting an existing external homogeneous magnetic stray field so that the magnetic field in the detection region of the magnetic field sensor changes in comparison with a situation in which the existing external homogeneous magnetic stray field is not present, wherein a spatial distortion of the existing external homogeneous magnetic stray field due to the ferromagnetic material causes the existing external homogeneous magnetic stray field to include, in addition to one or more homogeneous stray field components, one or more inhomogeneous stray field components of the existing external homogeneous magnetic stray field that leads to measurement errors in the rotation angle of the rotatable shaft determined by the magnetic field sensor, and
a holding device stationary relative to the rotatable shaft and configured to one or more of reduce the inhomogeneous stray field component or compensate for the inhomogeneous stray field component,
wherein the holding device includes a recess in which the magnetic field sensor is arranged,
wherein the holding device is arranged at a distance from the rotatable shaft and coaxially with the rotatable shaft to cause the magnetic field sensor arranged in the holding device to lie opposite to the permanent magnet,
wherein the holding device comprises a soft magnetic material into which magnetic field lines of the existing external homogeneous magnetic stray field, including the one or more inhomogeneous stray field components, penetrate and are guided through the holding device and past the magnetic field sensor without interfering with the magnetic field sensor, and
wherein the holding device is a disc-shaped plate having a center recessed portion and an outer flange that extends radially from the center recessed portion, wherein an inner diameter of the outer flange and the center recessed portion define the recess.

2. The magnetic angle sensor system as claimed in claim 1,
wherein the permanent magnet is a diametrically magnetized permanent magnet, a magnetization direction of the diametrically magnetized permanent magnet extending substantially perpendicularly to a longitudinal axis of the rotatable shaft.

3. A magnetic angle sensor system comprising:
a rotatable shaft including a shaft longitudinal axis and a bore starting from an axial end section of the rotatable shaft and extending partially into the rotatable shaft along the rotatable shaft longitudinal axis to an end of the bore,
a permanent magnet arranged inside the bore and coupled to the rotatable shaft at the end of the bore such that the permanent magnet co-rotates with the rotatable shaft, wherein the permanent magnet is arranged coaxially with the shaft longitudinal axis,
a magnetic field sensor arranged inside the bore and coaxially with the shaft longitudinal axis, wherein the magnetic field sensor is stationary relative to the permanent magnet, and wherein the magnetic field sensor is configured to detect a magnetic field prevailing in a detection region of the magnetic field sensor, wherein the magnetic field sensor is configured to generate, based on detecting the magnetic field, at least two differential sensor signals with which homogeneous stray field components can be compensated for, and to determine a rotation angle of the rotatable shaft based on the at least two differential sensor signals, wherein the rotatable shaft comprises a ferromagnetic material, the ferromagnetic material spatially distorting an existing external homogeneous magnetic stray field so that the magnetic field in the detection region of the magnetic field sensor changes in comparison with a situation in which the existing external homogeneous magnetic stray field is not present, wherein the spatial distortion of the existing external homogeneous magnetic stray field due to the ferromagnetic material causes the existing external homogeneous magnetic stray field to include, in addition to one or more homogeneous stray field components, one or more inhomogeneous stray field components of the existing external homogeneous magnetic stray field that lead to measurement errors in the determination of the rotation angle of the rotatable shaft determined by the magnetic field sensor, and wherein the rotatable shaft is configured to shield the magnetic field sensor from the one or more inhomogeneous stray field components.

4. The magnetic angle sensor system as claimed in claim 3, wherein the bore is configured as a blind hole, and wherein the permanent magnet is arranged at an end of the blind hole.

5. The magnetic angle sensor system as claimed in claim 3, wherein the magnetic field sensor, as seen in an axial direction, is arranged between the permanent magnet and the axial end section of the rotatable shaft.

6. The magnetic angle sensor system as claimed in claim 1, wherein the magnetic field sensor is stationary relative to the rotatable shaft and does not co-rotate with the rotatable shaft.

7. The magnetic angle sensor system as claimed in claim 1, wherein the permanent magnet is a bipolarly axially magnetized permanent magnet, which comprises a first pole pair and a second pole pair, and wherein magnetization directions of the first pole pair and magnetization directions of the second pole pair are respectively directed oppositely and extend substantially parallel to a longitudinal axis of the rotatable shaft.

8. The magnetic angle sensor system as claimed in claim 1, wherein the outer flange attracts the one or more homogeneous stray field components and the one or more inhomogeneous stray field components such that the existing external homogeneous magnetic stray field does not interfere with the magnetic field sensor.

9. The magnetic angle sensor system as claimed in claim 1, wherein the disc-shaped plate is configured to receive the existing external homogeneous magnetic stray field, including the one or more inhomogeneous stray field components, at an outer diameter of the outer flange, and wherein the disc-shaped plate is configured to guide the existing external homogeneous magnetic stray field, including the one or more inhomogeneous stray field components, through an input portion of outer flange, through the center recessed portion, and through an output portion of the outer flange arranged opposite to the input portion.

10. The magnetic angle sensor system as claimed in claim 1, wherein a depth of the recess is substantially equal to a thickness of the magnetic field sensor.

11. The magnetic angle sensor system as claimed in claim 3, wherein the rotatable shaft deflects the existing external homogeneous magnetic stray field and prevents the existing external homogeneous magnetic stray field from entering the bore.

12. The magnetic angle sensor system as claimed in claim 3, wherein the rotatable shaft prevents the existing external homogeneous magnetic stray field from interfering with the magnetic field sensor.

13. The magnetic angle sensor system as claimed in claim 3, wherein the rotatable shaft prevents the one or more inhomogeneous stray field components from interfering with the magnetic field sensor.

14. The magnetic angle sensor system as claimed in claim 3, wherein the permanent magnet and the magnetic field sensor are arranged entirely within the bore.

15. The magnetic angle sensor system as claimed in claim 3, wherein the permanent magnet and the magnetic field sensor are arranged on the shaft longitudinal axis.

* * * * *